US012677520B2

(12) United States Patent
Lee et al.

(10) Patent No.: US 12,677,520 B2
(45) Date of Patent: Jul. 7, 2026

(54) TRANSISTOR AND DISPLAY DEVICE

(71) Applicant: Samsung Display Co., Ltd., Yongin-si (KR)

(72) Inventors: Jong Chan Lee, Yongin-si (KR); Jin Taek Kim, Yongin-si (KR); Hyun Kim, Yongin-si (KR); Jeong Su Park, Yongin-si (KR); Sung Jin Lee, Yongin-si (KR); Woong Hee Jeong, Yongin-si (KR); Jung Eun Hong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 582 days.

(21) Appl. No.: 18/161,596

(22) Filed: Jan. 30, 2023

(65) Prior Publication Data

US 2023/0282684 A1 Sep. 7, 2023

(30) Foreign Application Priority Data

Mar. 3, 2022 (KR) ........................ 10-2022-0027506

(51) Int. Cl.
*H01L 33/24* (2010.01)
*H01L 27/15* (2006.01)
*H10D 30/67* (2025.01)
*H10D 99/00* (2025.01)
*H10H 20/821* (2025.01)
(Continued)

(52) U.S. Cl.
CPC ...... *H10H 29/142* (2025.01); *H10D 30/6723* (2025.01); *H10D 30/6729* (2025.01);
(Continued)

(58) Field of Classification Search
CPC ...... H10D 86/40; H10D 86/00; H10D 86/451; H10D 86/443; H10D 86/60; H10D 99/00; H10D 30/6723; H10D 30/67; H10D 30/6729; H10D 30/6755; H10D 30/6713; H10H 20/821; H10H 20/84; H10H 20/08; H10H 20/85; H10H 29/142; H10H 29/14; H10H 29/41733; H10H 29/1225;
(Continued)

(56) References Cited

U.S. PATENT DOCUMENTS 7,374,979 B2 5/2008 Seo et al.
10,483,340 B2 11/2019 Kwon
(Continued)

FOREIGN PATENT DOCUMENTS

CN 111584509 A 8/2020
CN 111584516 A 8/2020
(Continued)

*Primary Examiner* — Nikolay K Yushin
(74) *Attorney, Agent, or Firm* — Womble Bond Dickinson (US) LLP

(57) ABSTRACT

Provided herein may be a display device and a transistor. The display device may comprise a semiconductor pattern on a substrate and defining a hole, an insulating layer on the semiconductor pattern, and defining an opening area overlapping the hole, a gate electrode, a source electrode contacting a conductive area of the semiconductor pattern through the opening area, and a drain electrode on the insulating layer, electrodes respectively on the gate electrode, the source electrode, and the drain electrode, and spaced apart from each other, and light emitting elements between the electrodes, respectively.

9 Claims, 19 Drawing Sheets

(51) Int. Cl.
  H10H 20/84          (2025.01)
  H10H 29/14          (2025.01)

(52) U.S. Cl.
  CPC ......... H10D 30/6755 (2025.01); H10D 99/00
      (2025.01); H10H 20/821 (2025.01); H10H
                                20/84 (2025.01)

(58) Field of Classification Search
  CPC .. H10H 20/857; H10H 20/83; H01L 25/0753;
      H01L 25/075; H01L 25/167; H01L 25/16;
                                      H10W 90/00
  See application file for complete search history.

(56)                References Cited

U.S. PATENT DOCUMENTS 11,362,163  B2 *   6/2022  Tang ................. H10D 30/6723
  11,742,470  B2 *   8/2023  Choi ................. H10H 20/8506
                                            257/79

11,765,943  B2 *   9/2023  Yang ........................ G03F 1/38
  2021/0193893  A1 *   6/2021  Choi ................... H10K 59/131
  2021/0351171  A1    11/2021  Yoo et al.
  2021/0391396  A1 *  12/2021  Yang ................... H10K 59/122
  2022/0045153  A1 *   2/2022  Tang ................. H10D 30/6713
  2022/0336527  A1    10/2022  Cha et al.
  2022/0375990  A1    11/2022  Im et al.

FOREIGN PATENT DOCUMENTS

CN            112420741  A      2/2021
  KR          10-0721555  B1      5/2007
  KR      10-2017-0115640  A     10/2017
  KR      10-2021-0031588  A      3/2021
  KR          10-2358423  B1      2/2022
  WO      WO 2015/097597  A1      7/2015
  WO          2021/045605  A1      3/2021

* cited by examiner

TRANSISTOR AND DISPLAY DEVICE

CROSS-REFERENCE TO RELATED APPLICATION

This application claims priority to, and the benefit of, Korean patent application number 10-2022-0027506 filed on Mar. 3, 2022 in the Korean Intellectual Property Office, the entire disclosure of which is incorporated herein in its entirety by reference.

BACKGROUND

1. Field

Various embodiments of the present disclosure relates to a transistor and a display device.

2. Description of Related Art

Recently, as interest in information display increases, research and development on display devices have been continuously conducted.

SUMMARY

Various embodiments of the present disclosure are directed to a transistor and a display device, which may be fabricated through a simplified fabrication process and may provide improved device reliability.

The aspects of the present disclosure are not limited to the above-stated aspects, and those skilled in the art will clearly understand other not mentioned objects from the accompanying claims.

A display device in accordance with one or more embodiments of the present disclosure may include a semiconductor pattern on a substrate and defining a hole, an insulating layer on the semiconductor pattern, and defining an opening area overlapping the hole, a gate electrode, a source electrode contacting a conductive area of the semiconductor pattern through the opening area, and a drain electrode on the insulating layer, electrodes respectively on the gate electrode, the source electrode, and the drain electrode, and spaced apart from each other, and light emitting elements between the electrodes, respectively.

The gate electrode, the source electrode, and the drain electrode may be on a same layer.

The conductive area of the semiconductor pattern may include a tail exposed from the source electrode.

The source electrode may include a first layer, and a second layer on the first layer, wherein the first layer includes a tail exposed from the second layer.

The display device may further include a bottom conductive layer between the substrate and the semiconductor pattern.

The source electrode may contact the bottom conductive layer.

The display device may further include a bank on the electrodes.

The electrodes may be respectively between parts of the bank.

The display device may further include a first connection electrode on first ends of the light emitting elements, and a second connection electrode on second ends of the light emitting elements.

The first connection electrode and the second connection electrode may be provided on a same layer.

A transistor in accordance with one or more embodiments of the present disclosure may include a semiconductor pattern on a substrate, and defining a first hole, an insulating layer on the semiconductor pattern, and defining a first opening area overlapping the first hole, and a gate electrode, a source electrode contacting a first area of the semiconductor pattern through the first opening area, and a drain electrode on the insulating layer.

The gate electrode, the source electrode, and the drain electrode may be on a same layer.

The first area of the semiconductor pattern may include a first tail exposed from the source electrode.

The source electrode may include a first layer, and a second layer on the first layer, wherein the first layer includes a tail exposed from the second layer.

The insulating layer may further define a second opening area, wherein the drain electrode contacts a second area of the semiconductor pattern through the second opening area.

The semiconductor pattern may further define a second hole overlapping the second opening area.

The second area of the semiconductor pattern may include a second tail exposed from the drain electrode.

The gate electrode may be between the first opening area and the second opening area in plan view.

The transistor may further include a bottom conductive layer between the substrate and the semiconductor pattern.

The source electrode may contact the bottom conductive layer.

Details of various embodiments are included in the detailed descriptions and drawings.

DETAILED DESCRIPTION

Figure 1:
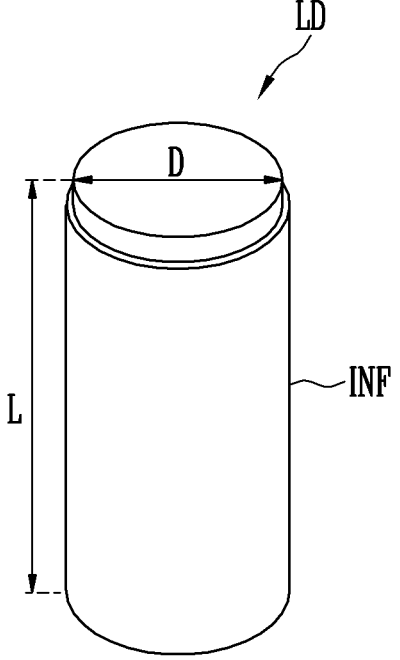
FIG. 1 is a perspective view illustrating a light emitting element in accordance with one or more embodiments.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. Furthermore, the term "coupling" or "connection" may comprehensively refer to physical and/or electrical coupling or connection. In addition, the term "coupling" or "connection" may comprehensively refer to direct or indirect coupling or connection and integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. Meanwhile, other expressions describing relationships between components, such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions, such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression, such as "at least one of A and B" may include A, B, or A and B. As used herein, "or" generally means "and/or," and the term "and/or" includes any and all combinations of one or more of the associated listed items. For example, the expression, such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

When one or more embodiments may be implemented differently, a specific process order may be performed differently from the described order. For example, two consecutively described processes may be performed substantially at the same time or performed in an order opposite to the described order.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Hereinafter, embodiments of the present disclosure will be described in detail with reference to the accompanying drawings.

Figure 2:
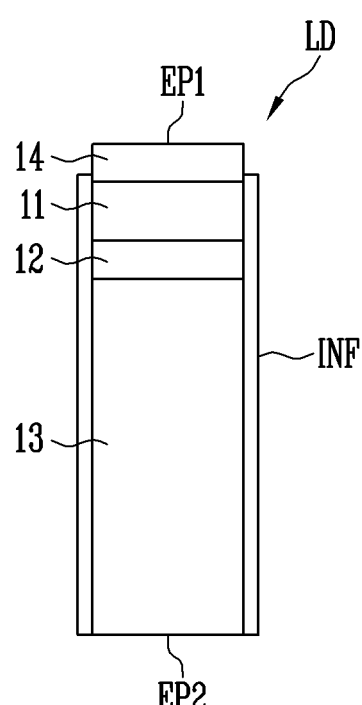
FIG. 2 is a sectional view illustrating a light emitting element in accordance with one or more embodiments.

FIG. 1 is a perspective view illustrating a light emitting element in accordance with one or more embodiments. FIG. 2 is a sectional view illustrating a light emitting element in accordance with one or more embodiments. Although FIGS. 1 and 2 illustrate a column-type light emitting element LD, the type and/or shape of the light emitting element LD is not limited thereto.

Referring to FIGS. 1 and 2, the light emitting element LD may include a first semiconductor layer 11, an active layer 12, a second semiconductor layer 13, and/or an electrode layer 14.

The light emitting element LD may be provided in the form of a column extending in one direction. The light emitting element LD may include a first end EP1 and a second end EP2. One of the first and second semiconductor layers 11 and 13 may be located on the first end EP1 of the light emitting element LD. The other one of the first and second semiconductor layers 11 and 13 may be located on the second end EP2 of the light emitting element LD. For example, the first semiconductor layer 11 may be located on the first end EP1 of the light emitting element LD, and the second semiconductor layer 13 may be located on the second end EP2 of the light emitting element LD.

In one or more embodiments, the light emitting element LD may be a light emitting element fabricated in a column shape by an etching scheme or the like. In the present specification, the term "column-type" embraces a rod-like shape and a bar-like shape, such as a cylindrical shape and a prismatic shape having an aspect ratio greater than 1, and the cross-sectional shape thereof is not limited.

The light emitting element LD may have a small size corresponding to a range from the nanometer scale to the micrometer scale. For example, the light emitting element LD may have a diameter D (or a width) and/or a length L ranging from the nanometer scale to the micrometer scale. However, the size of the light emitting element LD is not limited thereto, and the size of the light emitting element LD may be changed in various ways depending on design conditions of various devices (e.g., a display device) using a light emitting device with the light emitting element LD as a light source.

The first semiconductor layer 11 may be a first conductive semiconductor layer. For example, the first semiconductor layer 11 may include a p-type semiconductor layer. For instance, the first semiconductor layer 11 may include a p-type semiconductor layer that includes any one semiconductor material of InAlGaN, GaN, AlGaN, InGaN, or AlN, and is doped with a first conductive dopant, such as Mg. However, the material for forming the first semiconductor layer 11 is not limited thereto, and the first semiconductor layer 11 may be formed of various other materials.

The active layer 12 may be located between the first semiconductor layer 11 and the second semiconductor layer 13. The active layer 12 may include any one structure of a single well structure, a multi-well structure, a single-quantum well structure, a multi-quantum well (MQW) structure, a quantum dot structure, and a quantum line structure, but the present disclosure is not limited thereto. The active layer 12 may include GaN, InGaN, InAlGaN, AlGaN, or AlN. In addition, various other materials may be used to form the active layer 12.

If a voltage equal to or greater than a threshold voltage is applied between the opposite ends of the light emitting element LD, the light emitting element LD may emit light by coupling of electron-hole pairs in the active layer 12. Because light emission of the light emitting element LD can be controlled based on the foregoing principle, the light emitting element LD may be used as a light source of various light emitting devices as well as a pixel of the display device.

The second semiconductor layer 13 may be located on the active layer 12 and may include a semiconductor layer having a type different from that of the first semiconductor layer 11. The second semiconductor layer 13 may include an n-type semiconductor layer. For instance, the second semiconductor layer 13 may include an n-type semiconductor layer that includes any one semiconductor material of InAlGaN, GaN, AlGaN, InGaN, and AlN, and is doped with a second conductive dopant, such as Si, Ge, or Sn. However, the material for forming the second semiconductor layer 13 is not limited thereto, and the second semiconductor layer 13 may be formed of various other materials.

The electrode layer 14 may be located on the first end EP1 and/or the second end EP2 of the light emitting element LD. Although FIG. 2 illustrates the case where the electrode layer 14 is formed on the first semiconductor layer 11, the present disclosure is not limited thereto. For example, a separate electrode layer may be further located on the second semiconductor layer 13.

The electrode layer 14 may include transparent metal or transparent metal oxide. For example, the electrode layer 14 may include at least one of indium tin oxide (ITO), indium zinc oxide (IZO), and zinc tin oxide (ZTO), but the present disclosure is not limited thereto. As such, in case that the electrode layer 14 is formed of transparent metal or transparent metal oxide, light generated from the active layer 12 of the light emitting element LD may be emitted out of the light emitting element LD through the electrode layer 14.

An insulating layer INF may be provided on a surface of the light emitting element LD. The insulating layer INF may be directly located on a surface of the first semiconductor layer 11, a surface of the active layer 12, a surface of the second semiconductor layer 13, and/or a surface of the electrode layer 14. The insulating layer INF may allow the first and second ends EP1 and EP2 of the light emitting element LD that have different polarities to be exposed. In one or more embodiments, the insulating layer INF may allow a sidewall of the electrode layer 14 and/or the second semiconductor layer 13 located adjacent to the first and second ends EP1 and EP2 of the light emitting element LD to be exposed.

The insulating layer INF may reduce or prevent the likelihood of the active layer 12 short-circuiting due to contacting conductive material except the first and second semiconductor layers 11 and 13. Furthermore, the insulating layer INF may reduce or minimize a surface defect of the light emitting elements LD, thus enhancing the lifetime and emission efficiency of the light emitting elements LD.

The insulating film INF may include at least one of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium dioxide ($TiO_x$). For example, the insulating layer INF may have a double layer structure, and respective layers that form the double layer structure may include different materials. For example, the insulating layer INF may have a double layer structure formed of aluminum oxide ($AlO_x$) and silicon oxide ($SiO_x$), but the present disclosure is not limited thereto. In one or more embodiments, the insulating layer INF may be omitted.

A light emitting device including the light emitting element LD described above may be used not only in a display device but also in various devices that may suitably use a light source. For instance, light emitting elements LD may be located in each pixel of a display panel, so that the light emitting elements LD may be used as a light source of the pixel. However, the application field of the light emitting element LD is not limited to the above-mentioned examples. For example, the light emitting element LD may also be used in other types of devices, such as a lighting device, which may suitably use a light source.

Figure 3:
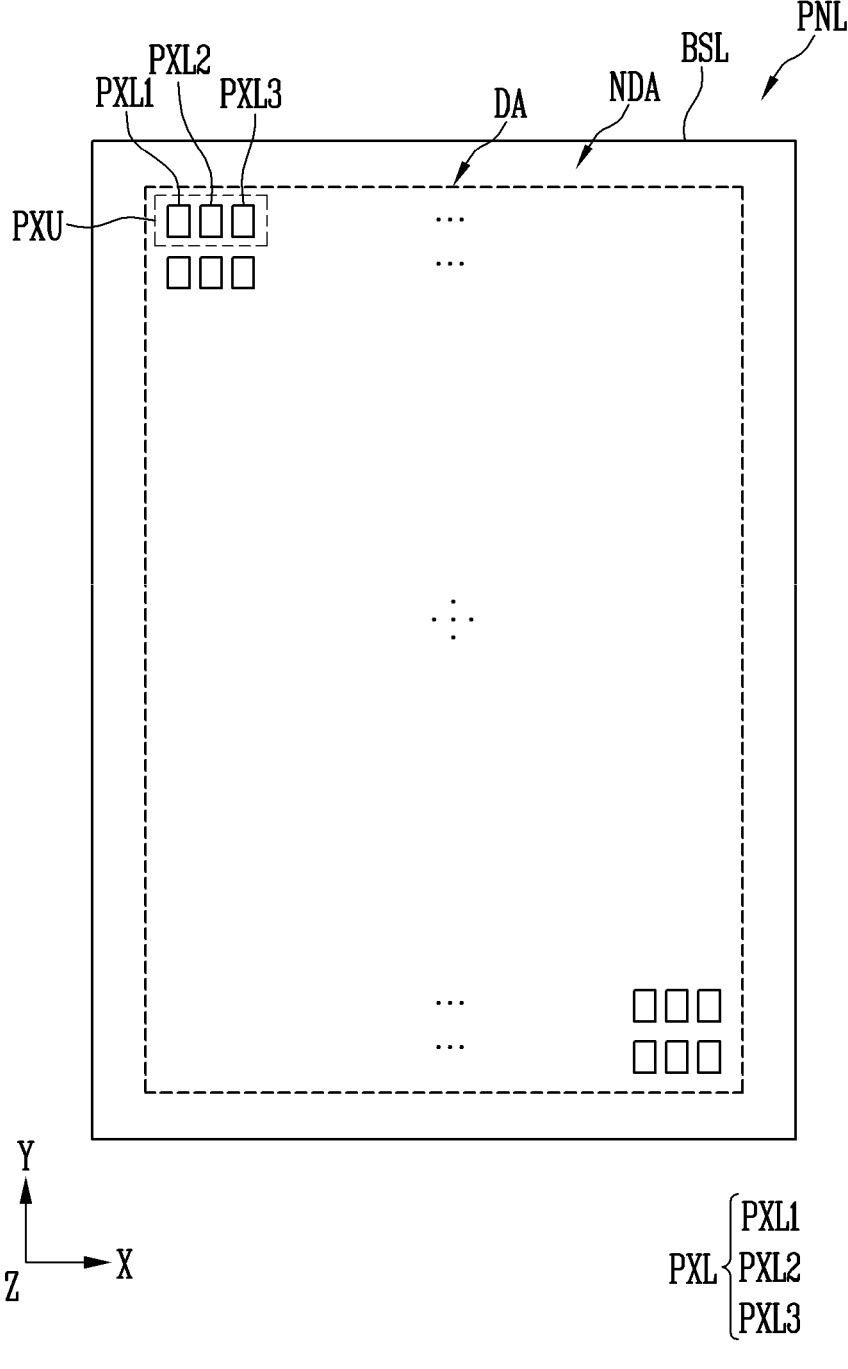
FIG. 3 is a plan view illustrating a display device in accordance with one or more embodiments.

FIG. 3 is a plan view illustrating a display device in accordance with one or more embodiments.

FIG. 3 illustrates a display device, for example, a display panel PNL provided in the display device, as an example of an electronic device that may use, as a light source, the light emitting element LD described in the embodiments of FIGS. 1 and 2.

For the sake of explanation, FIG. 3 simply illustrates the structure of the display panel PNL in accordance with one or more embodiments, focused on a display area DA. In some embodiments, at least one driving circuit (e.g., at least one of a scan driver and a data driver), lines, and/or pads may be further provided on the display panel PNL.

Referring to FIG. 3, the display panel PNL and the base layer BSL for forming the display panel PNL may include a display area DA for displaying an image, and a non-display area NDA other than the display area DA. The display area DA may form a screen on which an image is displayed. The non-display area NDA may be an area other than the display area DA.

A pixel unit PXU may be located in the display area DA. The pixel unit PXU may include a first pixel PXL1, a second pixel PXL2, and/or a third pixel PXL3. Hereinafter, the term "pixel PXL" or "pixels PXL" will be used to arbitrarily designate at least one pixel of the first pixel PXL1, the second pixel PXL2, and the third pixel PXL3, or collectively designate two or more kinds of pixels.

The pixels PXL may be regularly arranged according to a stripe or PENTILE™ arrangement structure (e.g., a PEN-TILE™ matrix structure, a PENTILE™ structure, or an RGBG structure, PENTILE™ being a registered trademark of Samsung Display Co., Ltd., Republic of Korea). The arrangement structure of the pixels PXL is not limited thereto, and the pixels PXL may be arranged in the display area DA in various structures and/or schemes.

In one or more embodiments, two or more kinds of pixels PXL that emit different colors of light may be located in the display area DA. For example, first pixels PXL1 configured to emit a first color of light, second pixels PXL2 configured to emit a second color of light, and third pixels PXL3 configured to emit a third color of light may be arranged in the display area DA. At least one first pixel PXL1, at least one second pixel PXL2, and at least one third pixel PXL3 that are located adjacent to each other may form one pixel unit PXU that may emit various colors of light. For example, each of the first to third pixels PXL1, PXL2, and PXL3 may be a pixel configured to emit a corresponding color of light. In one or more embodiments, the first pixel PXL1 may be a red pixel configured to emit red light, a second pixel PXL2 may be a green pixel configured to emit green light, and a third pixel PXL3 may be a blue light configured to emit blue light. However, the present disclosure is not limited thereto.

In one or more embodiments, the first pixel PXL1, the second pixel PXL2, and the third pixel PXL3 may respectively include light emitting elements configured to emit the same color of light, and color conversion layers and/or color filter layers pertaining to different colors may be located on the respective light emitting elements so that the first pixel PXL1, the second pixel PXL2, and the third pixel PXL3 may respectively emit the first color of light, the second color of light, and the third color of light. In one or more embodiments, the first pixel PXL1, the second pixel PXL2, and the third pixel PXL3 may respectively include, as light sources, a light emitting element related to the first color, a light emitting element related to the second color, and a light emitting element related to the third color, and thus may respectively emit the first color of light, the second color of light, and the third color of light. However, the colors, the types, and/or the number of pixels PXL that form each pixel unit PXU are not particularly limited. In other words, the color of light to be emitted from each pixel PXL may be changed in various ways.

The pixel PXL may include at least one light source that is driven by a control signal (e.g., a scan signal and a data signal) and/or a power supply (e.g., a first power supply and a second power supply). In one or more embodiments, the light source may include at least one light emitting element LD in accordance with any one of the embodiments of FIGS. 1 and 2 (e.g., subminiature column-type light emitting elements LD having a small size corresponding to a range from the nanometer scale to the micrometer scale). However, the present disclosure is not limited thereto, and different types of light emitting elements LD may be used as a light source of the pixel PXL.

In one or more embodiments, each pixel PXL may be formed of an active pixel. However, the types, structures, and/or driving schemes of the pixels PXL applicable to the display device are not particularly limited. For example, each pixel PXL may be formed of a pixel for passive or active light emitting display devices that have various structures and/or may be operated in various driving schemes.

Figure 4:
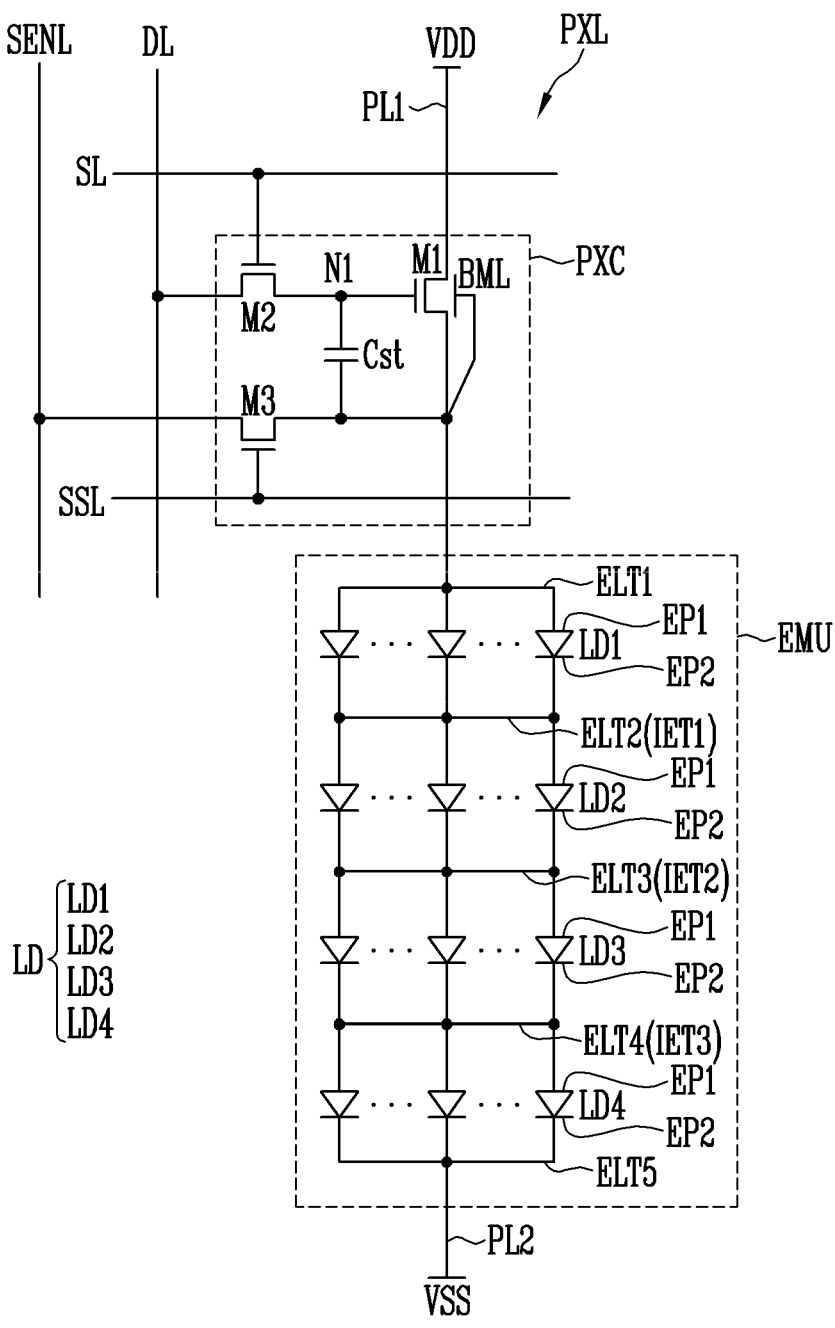
FIG. 4 is a circuit diagram illustrating a pixel in accordance with one or more embodiments.

FIG. 4 is a circuit diagram illustrating a pixel PXL in accordance with one or more embodiments.

The pixel PXL illustrated in FIG. 4 may be any one of the first pixel PXL1, the second pixel PXL2, and the third pixel PXL3 that are provided on the display panel PNL of FIG. 3. The first pixel PXL1, the second pixel PXL2, and the third pixel PXL3 may have substantially identical or similar structures.

Referring to FIG. 4, each pixel PXL may further include an emission component EMU configured to generate light having luminance corresponding to a data signal, and a pixel circuit PXC configured to drive the emission component EMU.

The pixel circuit PXC may be connected between a first power supply VDD and the emission component EMU. Furthermore, the pixel circuit PXC may be connected to a scan line SL and a data line DL of the corresponding pixel PXL, and may control the operation of the emission component EMU in response to a scan signal and a data signal supplied from the scan line SL and the data line DL. Furthermore, the pixel circuit PXC may be selectively further connected to a sensing signal line SSL and a sensing line SENL.

The pixel circuit PXC may include at least one transistor and at least one capacitor. For example, the pixel circuit PXC may include a first transistor M1, a second transistor M2, a third transistor M3, and a storage capacitor Cst.

The first transistor M1 may be connected between the first power supply VDD and a first connection electrode ELT1. A gate electrode of the first transistor M1 may be connected to the first node N1. The first transistor M1 may control driving current to be supplied to the emission component EMU in response to a voltage of the first node N1. In other words, the first transistor M1 may be a driving transistor configured to control the driving current of the pixel PXL.

In one or more embodiments, the first transistor M1 may selectively include a bottom conductive layer BML (referred also to as "bottom electrode," "back gate electrode," or "bottom light-shielding layer"). The gate electrode of the first transistor M1 and the bottom conductive layer BML may overlap each other with an insulating layer interposed therebetween. In one or more embodiments, the bottom conductive layer BML may be connected to one electrode of the first transistor M1 (e.g., a source or drain electrode of the first transistor M1).

In case that the first transistor M1 includes the bottom conductive layer BML, a back-biasing technique (or a sync technique) may be used, the back-biasing technique being a technique of shifting a threshold voltage of the first transistor M1 in a negative direction or in a positive direction by applying a bank-biasing voltage to the bottom conductive layer BML of the first transistor M1 when the pixel PXL is driven. For example, a source-sync technique may be used by connecting the bottom conductive layer BML to the source electrode of the first transistor M1, so that the threshold voltage of the first transistor M1 may be shifted in the negative direction or in the positive direction. In case that the bottom conductive layer BML is located under a semiconductor pattern that forms a channel of the first transistor M1, the bottom conductive layer BML may function as a light-shielding pattern and may stabilize operating characteristics of the first transistor M1. However, the function and/or application scheme of the bottom conductive layer BML is not limited thereto.

The second transistor M2 may be connected between the data line DL and the first node N1. A gate electrode of the second transistor M2 may be connected to the scan line SL.

When a scan signal having a gate-on voltage (e.g., a high-level voltage) is supplied from the scan line SL, the second transistor M2 may be turned on to connect the data line DL with the first node N1.

During each frame period, a data signal of the corresponding frame may be supplied to the data line DL, and the data signal may be transmitted to the first node N1 through the second transistor M2 that is turned on during a period during which the scan signal having the gate-on voltage is supplied to the scan line SL. In other words, the second transistor M2 may be a switching transistor configured to transmit each data signal to the interior of the pixel PXL.

One electrode of the storage capacitor Cst may be connected to the first node N1, and the other electrode thereof may be connected to a second electrode of the first transistor M1. The storage capacitor Cst may be charged with a voltage corresponding to a data signal to be supplied to the first node N1 during each frame period.

The third transistor M3 may be connected between the first connection electrode ELT1 (or the second electrode of the first transistor M1) and the sensing line SENL. A gate electrode of the third transistor M3 may be connected to the sensing signal line SSL. The third transistor M3 may transmit a voltage value, which is applied to the first connection electrode ELT1, to the sensing line SENL in response to a sensing signal supplied to the sensing signal line SSL. The voltage value transmitted through the sensing line SENL may be provided to an external circuit (e.g., a timing controller). The external circuit may extract information about characteristics of each pixel PXL (e.g., a threshold voltage of the first transistor M1, etc.) based on the provided voltage value. The extracted characteristic information may be used to convert image data to compensate for a deviation in characteristics between the pixels PXL.

Although FIG. 4 illustrates the case where all of the transistors included in the pixel circuit PXC are formed of n-type transistors, the present disclosure is not certainly limited thereto. For example, at least one of the first, second, and third transistors M1, M2, and M3 may be changed to a p-type transistor.

The structure and driving scheme of the pixel PXL may be changed in various ways. For instance, the pixel circuit PXC may not only be formed of the pixel circuit of the one or more embodiments corresponding to FIG. 4 but may also be formed of a pixel circuit that may have various structures and/or be operated in various driving schemes.

For example, the pixel circuit PXC may omit the third transistor M3. Furthermore, the pixel circuit PXC may further include other circuit elements, such as a compensation transistor configured to compensate for the threshold voltage of the first transistor M1, an initialization transistor configured to initialize the voltage of the first node N1 and/or the first connection electrode ELT1, an emission control transistor configured to control a period during which driving current is supplied to the emission component EMU, and/or a boosting capacitor configured to boost the voltage of the first node N1.

The emission component EMU may include at least one light emitting element LD (e.g., a plurality of light emitting elements LD) connected between the first power supply VDD and the second power supply VSS.

For example, the emission component EMU may include a first connection electrode ELT1 connected to the first power supply VDD by the pixel circuit PXC and the first power line PL1, a fifth connection electrode ELT5 connected to the second power supply VSS by the second power line PL2, and a plurality of light emitting elements LD connected between the first and fifth connection electrodes ELT1 and ELT5.

The first power supply VDD and the second power supply VSS may have different potentials to allow the light emitting elements LD to emit light. For example, the first power supply VDD may be set as a high-potential power supply, and the second power supply VSS may be set as a low-potential power supply.

In one or more embodiments, the emission component EMU may include at least one serial stage. Each serial stage may include a pair of electrodes (e.g., two electrodes), and at least one light emitting element LD connected in a forward direction between the pair of electrodes. Here, the number of serial stages that form the emission component EMU and the number of light emitting elements LD that form each serial stage are not particularly limited. For example, the numbers of light emitting elements LD that form the respective serial stages may be identical with or different from each other. The number of light emitting elements LD of each serial stage is not particularly limited.

For example, the emission component EMU may include a first serial stage including at least one first light emitting element LD1, a second serial stage including at least one second light emitting element LD2, a third serial stage including at least one third light emitting element LD3, and a fourth serial stage including at least one fourth light emitting element LD4.

The first serial stage may include a first connection electrode ELT1, a second connection electrode ELT2, and at least one first light emitting element LD1 connected between the first and second connection electrodes ELT1 and ELT2. Each first light emitting element LD1 may be connected in the forward direction between the first and second connection electrodes ELT1 and ELT2. For example, a first end EP1 of the first light emitting element LD1 may be connected to the first connection electrode ELT1. A second end EP2 of the first light emitting element LD1 may be connected to the second connection electrode ELT2.

The second serial stage may include the second connection electrode ELT2, a third connection electrode ELT3, and at least one second light emitting element LD2 connected between the second and third connection electrodes ELT2 and ELT3. Each second light emitting element LD2 may be connected in the forward direction between the second and third connection electrodes ELT2 and ELT3. For example, a first end EP1 of the second light emitting element LD2 may be connected to the second connection electrode ELT2. A second end EP2 of the second light emitting element LD2 may be connected to the third connection electrode ELT3.

The third serial stage may include the third connection electrode ELT3, a fourth connection electrode ELT4, and at least one third light emitting element LD3 connected between the third and fourth connection electrodes ELT3 and ELT4. Each third light emitting element LD3 may be connected in the forward direction between the third and fourth connection electrodes ELT3 and ELT4. For example, a first end EP1 of the third light emitting element LD3 may be connected to the third connection electrode ELT3. A second end EP2 of the third light emitting element LD3 may be connected to the fourth connection electrode ELT4.

The fourth serial stage may include the fourth connection electrode ELT4, the fifth connection electrode ELT5, and at least one fourth light emitting element LD4 connected between the fourth and fifth connection electrodes ELT4 and ELT5. Each fourth light emitting element LD4 may be connected in the forward direction between the fourth and fifth connection electrodes ELT4 and ELT5. For example, a first end EP1 of the fourth light emitting element LD4 may be connected to the fourth connection electrode ELT4. A second end EP2 of the fourth light emitting element LD4 may be connected to the fifth connection electrode ELT5.

The 1st electrode of the emission component EMU (e.g., the first connection electrode ELT1) may be an anode electrode of the emission component EMU. The last electrode of the emission component EMU (e.g., the fifth connection electrode ELT5) may be a cathode electrode of the emission component EMU.

The other electrodes of the emission component EMU (e.g., the second connection electrode ELT2, the third connection electrode ELT3, and/or the fourth connection electrode ELT4) each may form an intermediate electrode. For example, the second connection electrode ELT2 may form a first intermediate electrode IET1. The third connection electrode ELT3 may form a second intermediate electrode IET2. The fourth connection electrode ELT4 may form a third intermediate electrode IET3.

In case that the light emitting elements LD are connected to have a serial/parallel structure, power efficiency may be enhanced, compared to the case where an equal number of light emitting elements LD are connected only in parallel to each other. Furthermore, in the pixel PXL in which the light emitting elements LD are connected to have the serial/parallel structure, even if a short-circuit defect or the like occurs in some serial stages, sufficient luminance can be expressed by the light emitting elements LD of the other serial stages, so that the probability of occurrence of a black spot defect in the pixel PXL can be reduced. However, the present disclosure is not limited thereto. The emission component EMU may be formed by connecting the light emitting elements LD only in series. Alternatively, the emission component EMU may be formed by connecting the light emitting elements LD only in parallel.

Each of the light emitting elements LD may include a first end EP1 (e.g., a p-type end) connected to the first power supply VDD via at least one electrode (e.g., the first connection electrode ELT1), the pixel circuit PXC, and/or the first power line PL1, and may include a second end EP2 (e.g., an n-type end) connected to the second power supply VSS via at least another electrode (e.g., the fifth connection electrode ELT5), and the second power line PL2. In other words, the light emitting elements LD may be connected in the forward direction between the first power supply VDD and the second power supply VSS. The light emitting elements LD connected in the forward direction may form valid light sources of the emission component EMU.

The light emitting elements LD may emit light, when driving current is supplied thereto through the corresponding pixel circuit PXC, light having luminance corresponding to the driving current. For example, during each frame period, the pixel circuit PXC may supply driving current corresponding to a gray scale value to be expressed in the corresponding frame to the emission component EMU. Hence, the light emitting elements LD may emit light having luminance corresponding to the driving current, so that the emission component EMU may express the luminance corresponding to the driving current.

Figure 5:
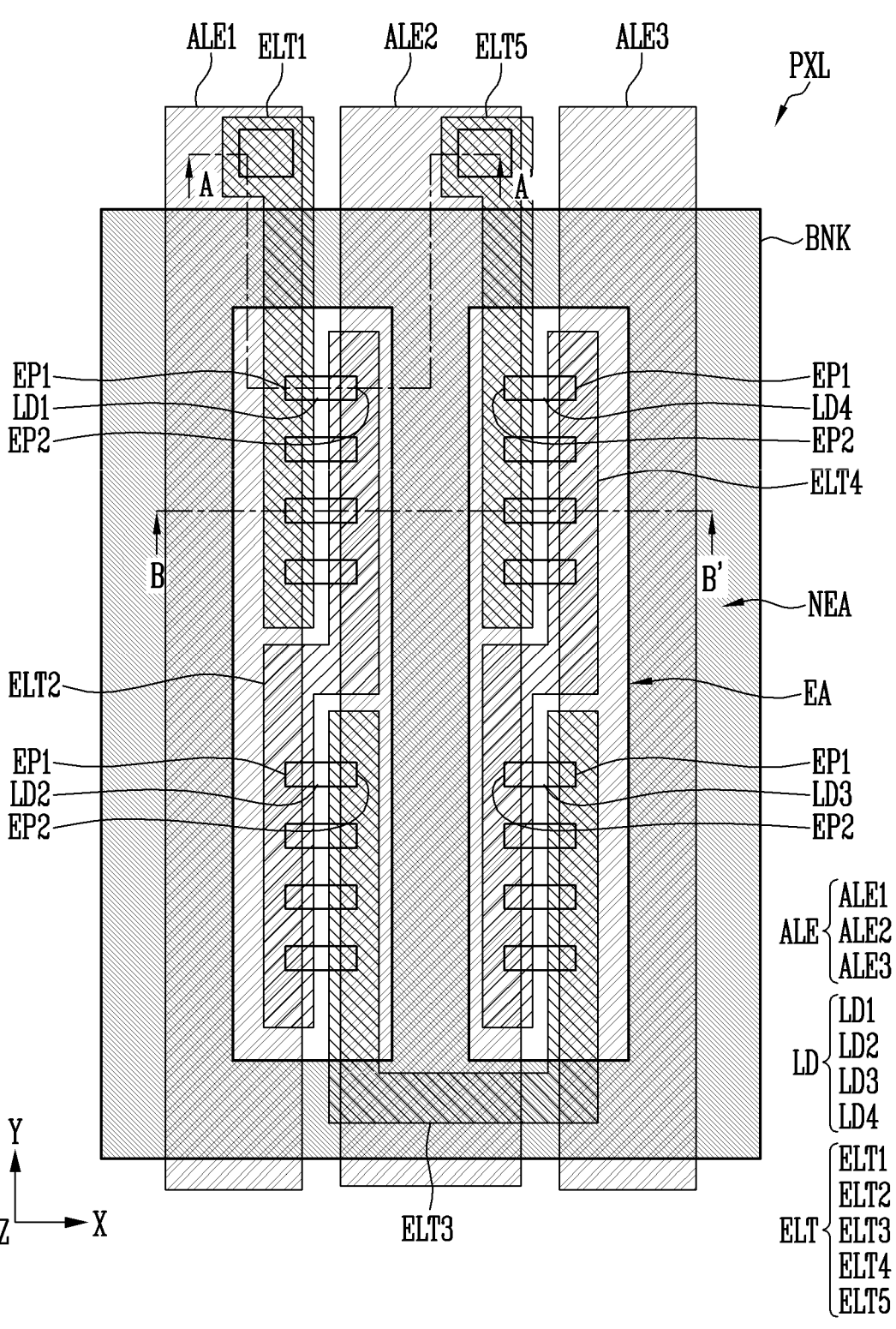
FIGS. 5 and 6 are plan views illustrating a pixel in accordance with one or more embodiments.
Figure 6:
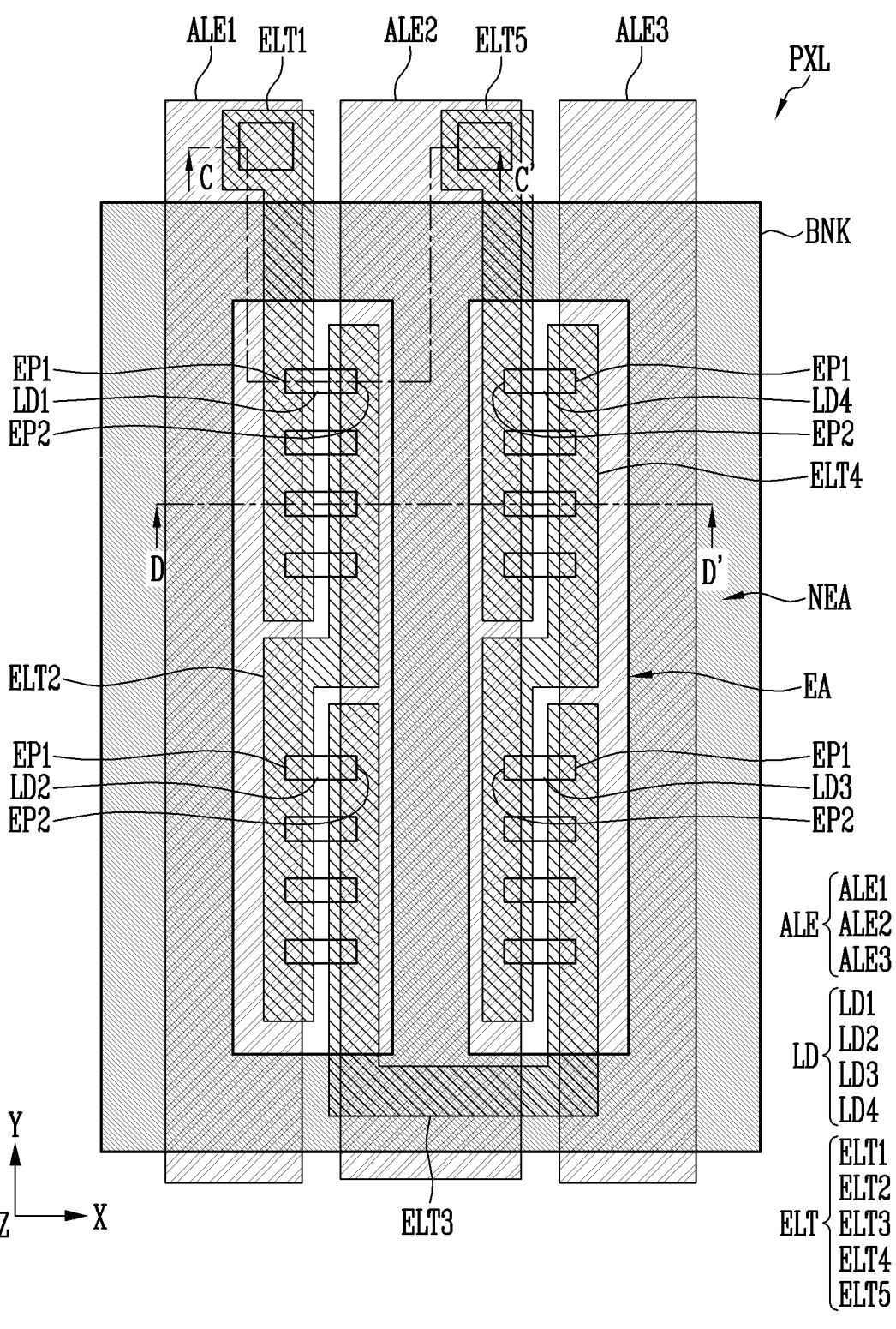
Figure 7:
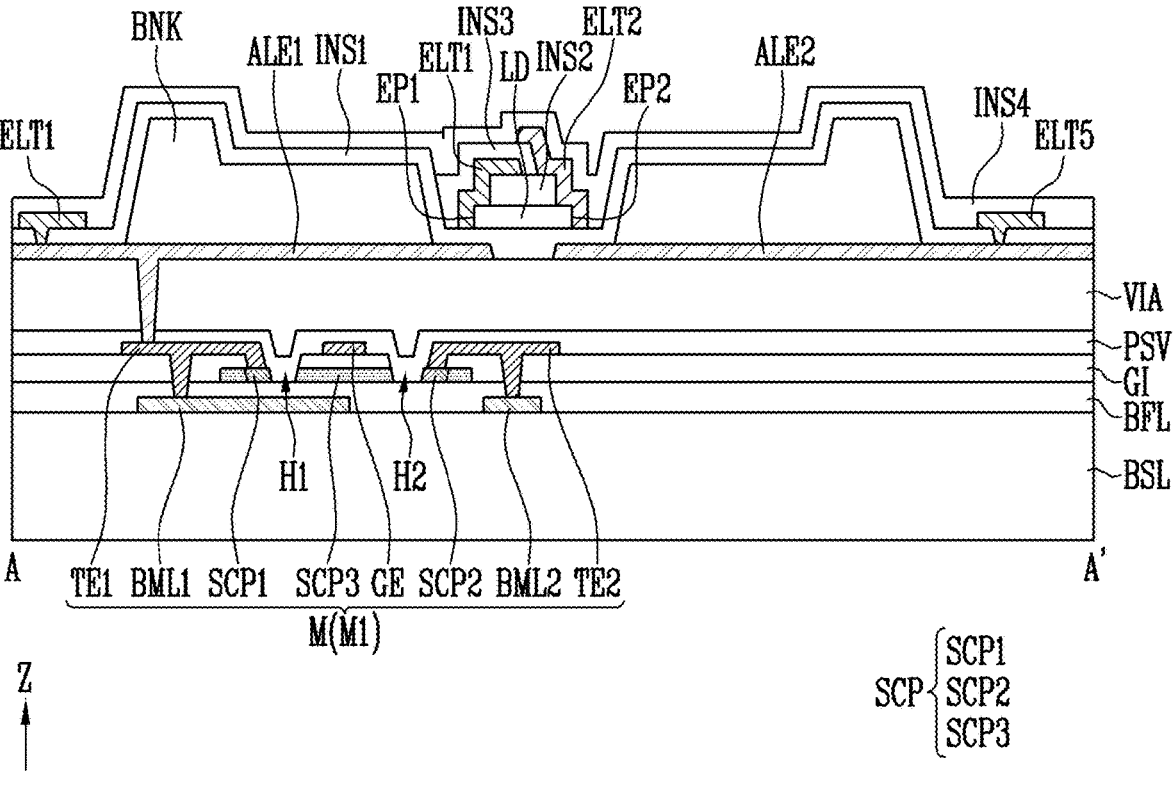
FIG. 7 is a sectional view taken along the line A-A' of FIG. 5.
Figure 8:
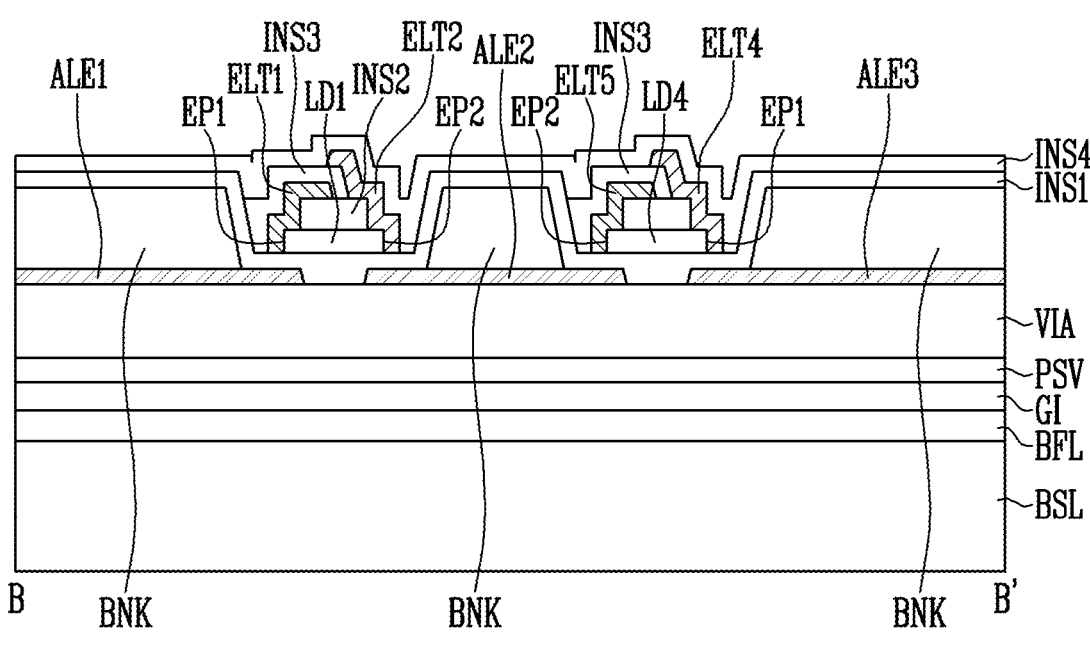
FIG. 8 is a sectional view taken along the line B-B' of FIG. 5.
Figure 8:
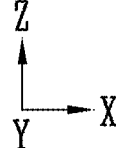
Figure 9:
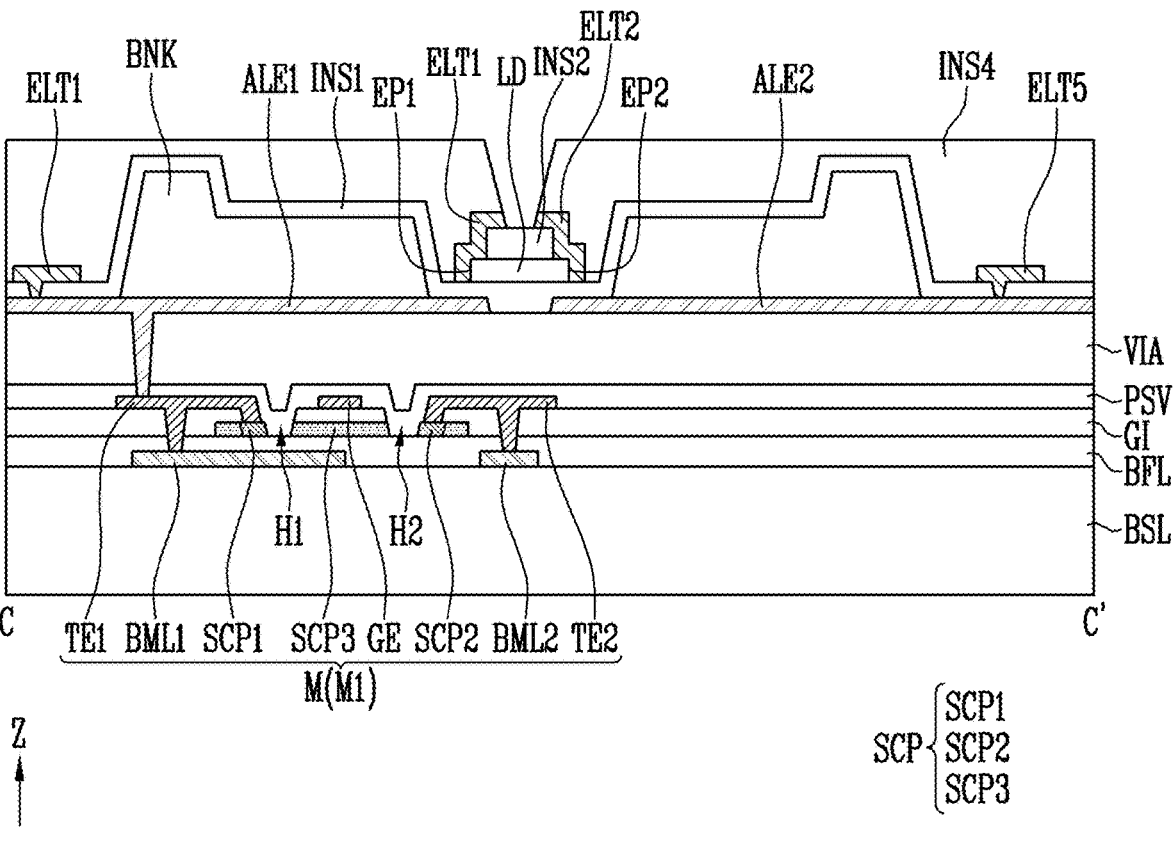
FIG. 9 is a sectional view taken along the line C-C' of FIG. 6.
Figure 10:
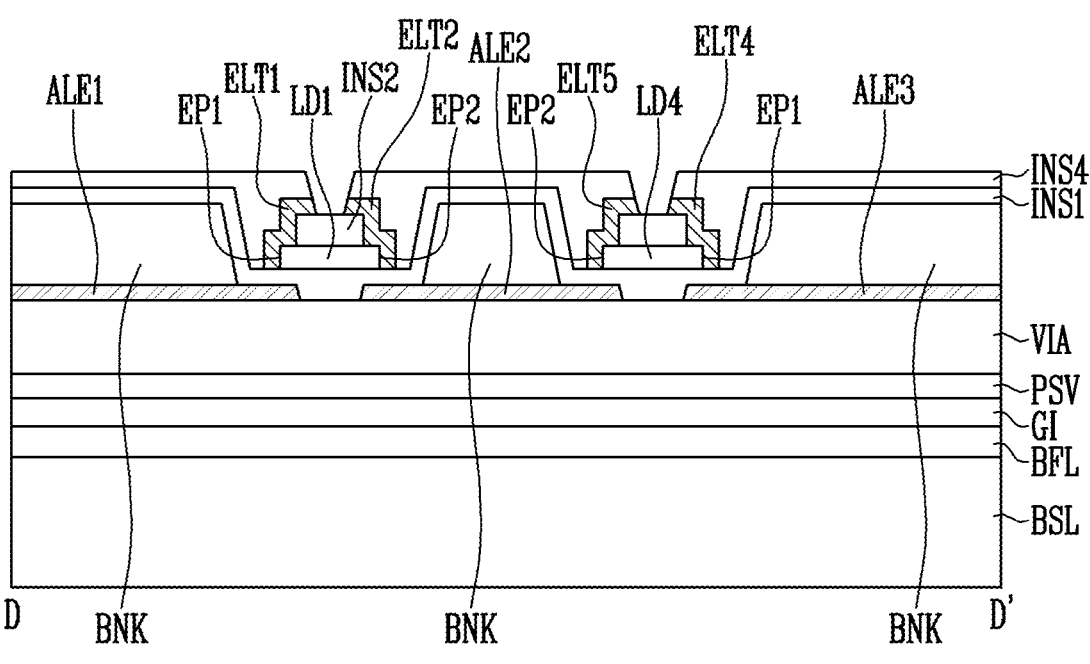
FIG. 10 is a sectional view taken along the line D-D' of FIG. 6.
Figure 10:
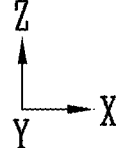
Figure 11:
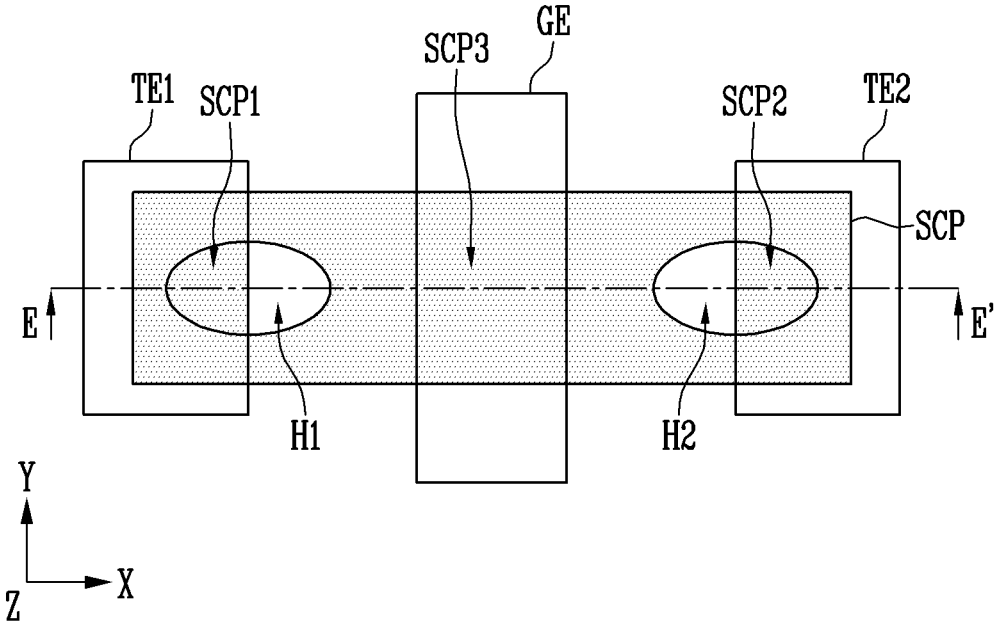
FIG. 11 is a plan view illustrating a transistor in accordance with one or more embodiments.
Figure 12:
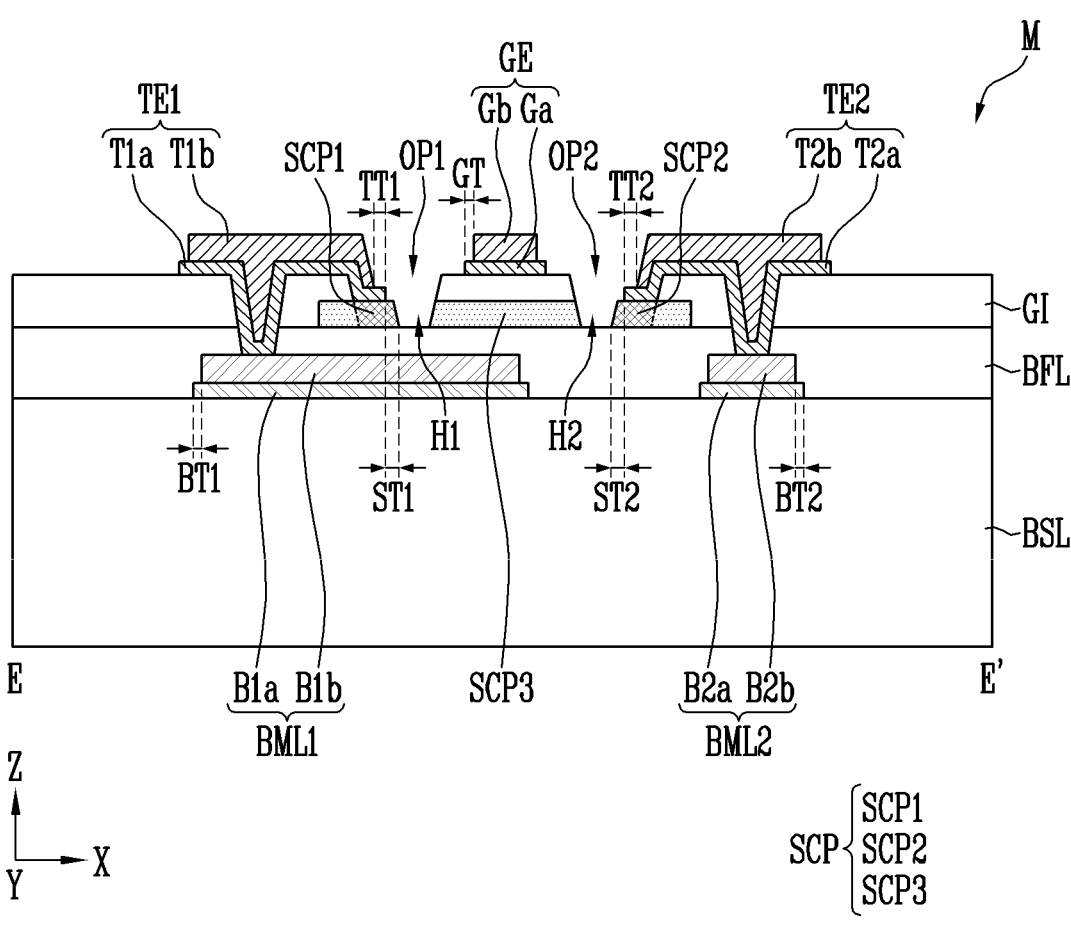
FIGS. 12 to 14 are sectional views taken along the line E-E' of FIG. 11.
Figure 13:
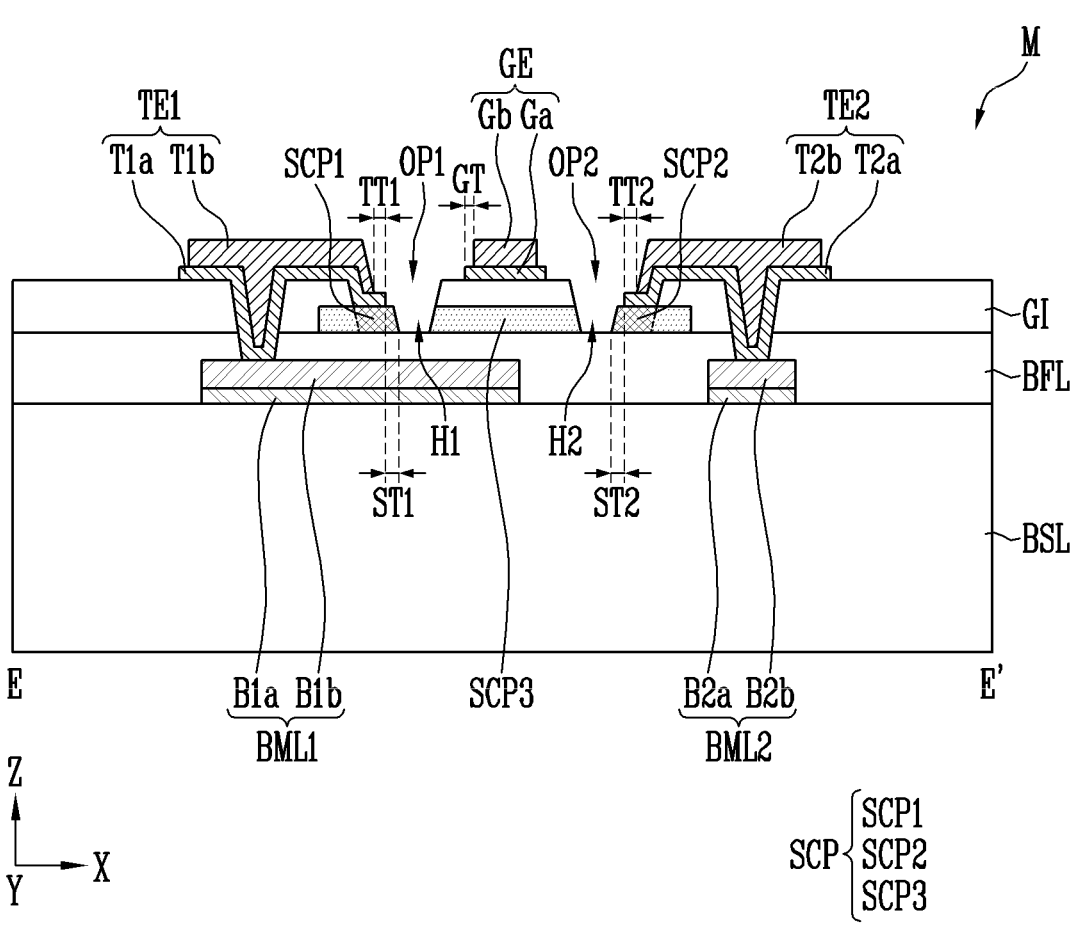
Figure 14:
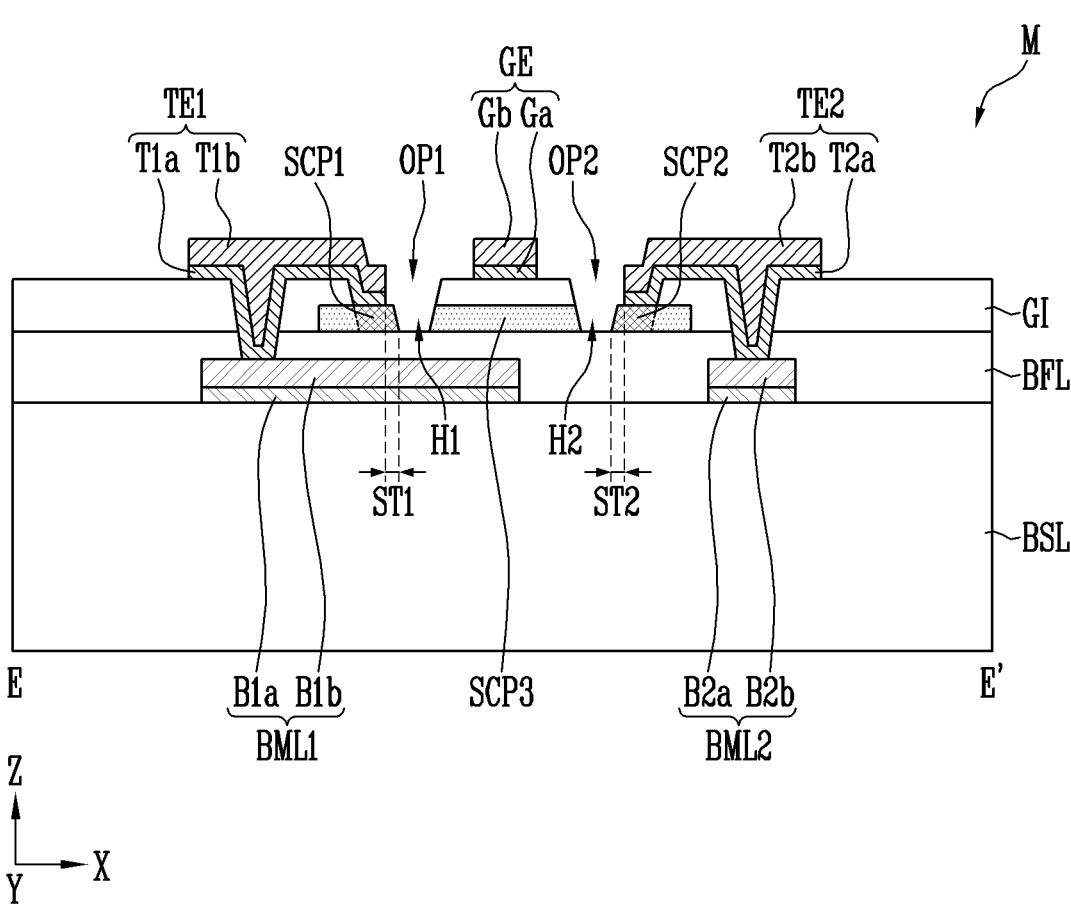

FIGS. 5 and 6 are plan views illustrating a pixel in accordance with one or more embodiments. FIG. 7 is a sectional view taken along the line A-A' of FIG. 5. FIG. 8 is a sectional view taken along the line B-B' of FIG. 5. FIG. 9 is a sectional view taken along the line C-C' of FIG. 6. FIG. 10 is a sectional view taken along the line D-D' of FIG. 6. FIG. 11 is a plan view illustrating a transistor in accordance with one or more embodiments. FIGS. 12 to 14 are sectional views taken along the line E-E' of FIG. 11.

For example, the pixel PXL of FIGS. 5 and 6 may be any one of the first to third pixels PXL1, PXL2, and PXL3 that form the pixel unit PXU of FIG. 3, and the first to third pixels PXL1, PXL2, and PXL3 may have substantially identical or similar structures. Although FIGS. 5 and 6 illustrates one or more embodiments in which, as illustrated in FIG. 4, each pixel PXL includes light emitting elements LD located in four serial stages, the number of serial stages in the pixel PXL may be changed in various ways depending on embodiments.

Hereinafter, the term "light emitting element LD" or "light emitting elements LD" will be used to arbitrarily designate at least one light emitting element of the first to fourth light emitting elements LD1, LD2, LD3, and LD4, or will be used to collectively designate two or more kinds of light emitting elements. Furthermore, the term "electrode ALE" or "electrodes ALE" will be used to arbitrarily designate at least one of electrodes including the first to third electrodes ALE1, ALE2, and ALE3. The term "connection electrode ELT" or "connection electrodes ELT" will be used to arbitrarily designate at least one of electrodes including the first to fifth connection electrodes ELT1, ELT2, ELT3, ELT4, and ELT5.

Referring to FIGS. 5 and 6, each pixel PXL may include an emission area EA and a non-emission area NEA. The emission area EA may be an area that includes light emitting elements LD and that is able to emit light. The non-emission area NEA may be located to enclose the emission area EA.

A bank BNK may be located in the non-emission area NEA. In one or more embodiments, the bank BNK may be partially located in the emission area EA.

The bank BNK may form, at the operation of supplying the light emitting elements LD to each pixel PXL, a dam structure for defining an area to which the light emitting elements LD are to be supplied. For example, a suitable kind and/or amount of light emitting element ink may be supplied to the area defined by the bank BNK.

The bank BNK may include organic material, such as acrylic resin, epoxy resin, phenolic resin, polyamide resin, polyimide resin, polyester resin, polyphenylene sulfide resin, or benzocyclobutene (BCB). However, the present disclosure is not limited thereto. The bank BNK may include various inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), or titanium oxide ($TiO_x$).

In one or more embodiments, the bank BNK may include at least one light-shielding material and/or reflective material. Therefore, a light leakage between adjacent pixels PXL may be reduced or prevented. For example, the bank BNK may include at least one black pigment.

The pixels PXL each may include electrodes ALE, light emitting elements LD, and/or connection electrodes ELT.

The electrodes ALE may be provided in at least the emission area EA. The electrodes ALE may extend in a second direction (a Y-axis direction) and may be spaced apart from each other in a first direction (an X-axis direction).

The electrodes ALE may at least partially overlap the above-stated bank BNK. The first to third electrodes ALE1, ALE2, and ALE3 each may extend in the second direction (the Y-axis direction), and may be spaced apart from each other in the first direction (the X-axis direction), and may be successively located. Some of the electrodes ALE may be connected to the pixel circuit (PXC of FIG. 4) and/or a power line through a contact hole.

In one or more embodiments, some of the electrodes ALE may be electrically connected to some of the connection electrodes ELT through a contact hole. For example, the first electrode ALE1 may be electrically connected to the first connection electrode ELT1 through a contact hole. The second electrode ALE2 may be electrically connected to the fifth connection electrode ELT5 through a contact hole.

A pair of alignment electrodes ALE adjacent to each other may be supplied with different signals at the operation of aligning the light emitting elements LD. For example, in case that the first to third electrodes ALE1, ALE2, and ALE3 are successively arranged in the first direction (the X-axis direction), the first electrode ALE1 and the second electrode ALE2 may be supplied with different alignment signals, and the second electrode ALE2 and the third electrode ALE3 may be supplied with different alignment signals.

Respective light emitting elements LD may be aligned between a pair of electrodes ALE in each emission area EA. Furthermore, the light emitting elements LD each may be electrically connected between a pair of connection electrodes ELT.

The first light emitting element LD1 may be aligned between the first and second electrodes ALE1 and ALE2. The first light emitting element LD1 may be electrically connected between the first and second connection electrodes ELT1 and ELT2. For example, the first light emitting element LD1 may be aligned in first areas (e.g., upper end areas) of the first and second electrodes ALE1 and ALE2. The first end EP1 of the first light emitting element LD1 may be electrically connected to the first connection electrode ELT1. The second end EP2 of the first light emitting element LD1 may be electrically connected to the second connection electrode ELT2.

The second light emitting element LD2 may be aligned between the first and second electrodes ALE1 and ALE2. The second light emitting element LD2 may be electrically connected between the second and third connection electrodes ELT2 and ELT3. For example, the second light emitting element LD2 may be aligned in second areas (e.g., lower end areas) of the first and second electrodes ALE1 and ALE2. The first end EP1 of the second light emitting element LD2 may be electrically connected to the second connection electrode ELT2. The second end EP2 of the second light emitting element LD2 may be electrically connected to the third connection electrode ELT3.

The third light emitting element LD3 may be aligned between the second and third electrodes ALE2 and ALE3. The third light emitting element LD3 may be electrically connected between the third and fourth connection electrodes ELT3 and ELT4. For example, the third light emitting element LD3 may be aligned in second areas (e.g., lower end areas) of the second and third electrodes ALE2 and ALE3. The first end EP1 of the third light emitting element LD3 may be electrically connected to the third connection electrode ELT3. The second end EP2 of the third light emitting element LD3 may be electrically connected to the fourth connection electrode ELT4.

The fourth light emitting element LD4 may be aligned between the second and third electrodes ALE2 and ALE3. The fourth light emitting element LD4 may be electrically connected between the fourth and fifth connection electrodes ELT4 and ELT5. For example, the fourth light emitting element LD4 may be aligned in first areas (e.g., upper end areas) of the second and third electrodes ALE2 and ALE3. The first end EP1 of the fourth light emitting element LD4 may be electrically connected to the fourth connection electrode ELT4. The second end EP2 of the fourth light emitting element LD4 may be electrically connected to the fifth connection electrode ELT5.

For example, the first light emitting element LD1 may be located in a left upper end area of the emission area EA. The second light emitting element LD2 may be located in a left lower end area of the emission area EA. The third light emitting element LD3 may be located in a right lower end area of the emission area EA. The fourth light emitting element LD4 may be located in a right upper end area of the emission area EA. Here, the arrangement and/or connection structure of the light emitting elements LD may be changed in various ways depending on the structure of the emission circuit EMU and/or the number of serial stages.

The connection electrodes ELT each may be provided in at least the emission area EA, and may be located to overlap at least one electrode ALE and/or light emitting element LD. For example, the connection electrodes ELT may be provided on the electrodes ALE and/or the light emitting elements LD in such a way that each of the connection electrodes ELT overlaps the corresponding electrodes ALE and/or the corresponding light emitting elements LD, whereby the connection electrodes ELT may be electrically connected to the light emitting elements LD.

The first connection electrode ELT1 may be located on the first area (e.g., the upper end area) of the first electrode ALE1 and on the first ends EP1 of the first light emitting elements LD1, and thus may be electrically connected to the first ends EP1 of the first light emitting elements LD1.

The second connection electrode ELT2 may be located on the first area (e.g., the upper end area) of the second electrode ALE2 and on the second ends EP2 of the first light emitting elements LD1, and thus may be electrically connected to the second ends EP2 of the first light emitting elements LD1. Furthermore, the second connection electrode ELT2 may be located on the second area (e.g., the lower end area) of the first electrode ALE1 and on the first ends EP1 of the second light emitting elements LD2, and thus may be electrically connected to the first ends EP1 of the second light emitting elements LD2. For example, the second connection electrode ELT2 may electrically connect the second ends EP2 of the first light emitting elements LD1 and the first ends EP1 of the second light emitting elements LD2 to each other in the emission area EA. To this end, the second connection electrode ELT2 may have a bent shape. For example, the second connection electrode ELT2 may have a bent or curved structure on a boundary between an area where at least one first light emitting element LD1 is located and an area where at least one second light emitting element LD2 is located.

The third connection electrode ELT3 may be located on the second area (e.g., the lower end area) of the second electrode ALE2 and on the second ends EP2 of the second light emitting elements LD2, and thus may be electrically connected to the second ends EP2 of the second light emitting elements LD2. Furthermore, the third connection electrode ELT3 may be located on the second area (e.g., the lower end area) of the third electrode ALE3 and on the first ends EP1 of the third light emitting elements LD3, and thus may be electrically connected to the first ends EP1 of the third light emitting elements LD3. For example, the third connection electrode ELT3 may electrically connect the second ends EP2 of the second light emitting elements LD2 and the first ends EP1 of the third light emitting elements LD3 to each other in the emission area EA. To this end, the third connection electrode ELT3 may have a bent shape. For example, the third connection electrode ELT3 may have a bent or curved structure on a boundary between an area where at least one second light emitting element LD2 is located and an area where at least one third light emitting element LD3 is located.

The fourth connection electrode ELT4 may be located on the second area (e.g., the lower end area) of the second electrode ALE2 and on the second ends EP2 of the third light emitting elements LD3, and thus may be electrically connected to the second ends EP2 of the third light emitting elements LD3. Furthermore, the fourth connection electrode ELT4 may be located on the first area (e.g., the upper end area) of the third electrode ALE3 and on the first ends EP1 of the fourth light emitting elements LD4, and thus may be electrically connected to the first ends EP1 of the fourth light emitting elements LD4. For example, the fourth connection electrode ELT4 may electrically connect the second ends EP2 of the third light emitting elements LD3 and the first ends EP1 of the fourth light emitting elements LD4 to each other in the emission area EA. To this end, the fourth connection electrode ELT4 may have a bent shape. For example, the fourth connection electrode ELT4 may have a bent or curved structure on a boundary between an area where at least one third light emitting element LD3 is located and an area where at least one fourth light emitting element LD4 is located.

The fifth connection electrode ELT5 may be located on the first area (e.g., the upper end area) of the second electrode ALE2 and on the second ends EP2 of the fourth light emitting elements LD4, and thus may be electrically connected to the second ends EP2 of the fourth light emitting elements LD4.

The first connection electrode ELT1, the third connection electrode ELT3, and/or the fifth connection electrode ELT5 may be formed of an identical conductive layer. Furthermore, the second connection electrode ELT2 and the fourth connection electrode ELT4 may be formed of an identical conductive layer. For example, as illustrated in FIG. 5, the connection electrodes ELT may be formed of a plurality of conductive layers. In other words, the first connection electrode ETL1, the third connection electrode ELT3, and/or the fifth connection electrode ELT5 may be formed of a first conductive layer. The second connection electrode ELT2 and the fourth connection electrode ELT4 may be formed of a second conductive layer that is different form the first conductive layer. Alternatively, as illustrated in FIG. 6, the first to fifth connection electrodes ELT1, ELT2, ELT3, ELT4, and ELT5 may be formed of an identical conductive layer. As such, in case that the first to fifth connection electrodes ELT1, ELT2, ELT3, ELT4, and ELT5 are formed of an identical conductive layer, the number of masks may be reduced, and a fabrication process may be simplified.

In this way, the light emitting elements LD aligned between the electrodes ALE may be connected in a suitable form by using the connection electrodes ELT. For example, the first light emitting elements LD1, the second light emitting elements LD2, the third light emitting elements LD3, and the fourth light emitting elements LD4 may be successively connected in series by using the connection electrodes ELT.

Hereinafter, a cross-sectional structure of the pixel PXL will be described in more detail with reference to FIGS. 7 to 14. FIGS. 7 and 9 illustrate a first transistor M1 of various circuit elements that form the pixel circuit (refer to PXC of FIG. 4). In case that there is no need to separately designate the first to third transistors M1, M2, and M3, the term "transistor M" will be collectively used. The structures of the transistors M and/or positions in layers thereof are not limited to those of the one or more embodiments corresponding to FIGS. 7 and 9 and may be changed in various ways depending on embodiments.

The pixels PXL in accordance with one or more embodiments may include circuit elements including transistors M located on the base layer BSL, and various lines connected to the circuit elements. The bank BNK, and the electrodes ALE, the light emitting elements LD, and/or the connection electrodes ELT that form the emission circuit EMU may be located on the circuit elements.

The base layer BSL may form a base, and may be formed of a rigid or flexible substrate or film. For example, the base layer BSL may be a rigid substrate made of glass or reinforced glass, a flexible substrate (or a thin film) formed of plastic or metal, or at least one insulating layer. The material and/or properties of the base layer BSL are not particularly limited. In one or more embodiments, the base layer BSL may be substantially transparent. Here, the words "substantially transparent" may mean that light can pass through the substrate SUB at a corresponding transmissivity or more. In one or more embodiments, the base layer BSL may be translucent or opaque. Furthermore, the base layer BSL may include reflective material in some embodiments.

A first bottom conductive layer BML1 and a second bottom conductive layer BML2 may be located on the base layer BSL. The first bottom conductive layer BML1 and the second bottom conductive layer BML2 may block light from being incident on a semiconductor pattern SCP to be described below, thus reducing or preventing the likelihood of current leakage of the semiconductor pattern SCP occurring.

The first bottom conductive layer BML1 and the second bottom conductive layer BML2 may be located on the same layer. The first bottom conductive layer BML1 and the second bottom conductive layer BML2 may be concurrently or substantially simultaneously formed through the same process, but the present disclosure is not limited thereto.

The first bottom conductive layer BML1 and the second bottom conductive layer BML2 each may have a single layer structure or a multilayer structure that is formed of molybdenum (Mo), copper (Cu), aluminum (Al), chrome (Cr), gold (Au), titanium (Ti), nickel (Ni), neodymium (Nd), indium (In), tin (Sn), and an oxide or alloy thereof. For example, as illustrated in FIGS. 12 to 14, the first bottom conductive layer BML1 may include a first layer B1a and a second layer B1b. The second layer B1b of the first bottom conductive layer BML1 may be located on the first layer B1a of the first bottom conductive layer BML1. The first layer B1a of the first bottom conductive layer BML1 may be formed of titanium (Ti), and the second layer B1b of the first bottom conductive layer BML1 may be formed of copper (Cu), but the present disclosure is not limited thereto. As illustrated in FIG. 12, a tail BT1 may be formed during a process of etching the first bottom conductive layer BML1. The tail BT1 of the first bottom conductive layer BML1 may mean a part of the first layer B1a of the first bottom conductive layer BML1 that is exposed from the second layer B1b of the first bottom conductive layer BML1. However, the present disclosure is not limited thereto. As illustrated in FIGS. 13 and 14, the tail BT1 of the first bottom conductive layer BML1 may be omitted depending on etching processes.

Likewise, the second bottom conductive layer BML2 may include a first layer B2a and a second layer B2b. The second layer B2b of the second bottom conductive layer BML2 may be located on the first layer B2a of the second bottom conductive layer BML2. The first layer B2$a$ of the second bottom conductive layer BML2 may be formed of titanium (Ti), and the second layer B2$b$ of the second bottom conductive layer BML2 may be formed of copper (Cu), but the present disclosure is not limited thereto. As illustrated in FIG. 12, a tail BT2 may be formed during a process of etching the second bottom conductive layer BML2. The tail BT1 of the second bottom conductive layer BML2 may mean a part of the first layer B2$a$ of the second bottom conductive layer BML2 that is exposed from the second layer B2$b$ of the second bottom conductive layer BML2. However, the present disclosure is not limited thereto. As illustrated in FIGS. 13 and 14, the tail BT2 of the second bottom conductive layer BML2 may be omitted depending on etching processes.

A buffer layer BFL may be located on the first bottom conductive layer BML1 and the second bottom conductive layer BML2. The buffer layer BFL may reduce or prevent the likelihood of impurities diffusing into a circuit element. The buffer layer BFL may be formed of a single layer, or may be formed of multiple layers having at least two or more layers. In case that the buffer layer BFL has a multilayer structure, the respective layers may be formed of the same material or different materials.

A semiconductor pattern SCP may be located on the buffer layer BFL. The semiconductor pattern SCP may include, as an oxide semiconductor, at least one of indium gallium zinc oxide (IGZO), indium gallium oxide (IGO), and indium gallium tin oxide (IGTO), and indium zinc oxide (IZO).

The semiconductor pattern SCP may include a first area SCP1, a second area SCP2, and a third area SCP3 that is located between the first area SCP1 and the second area SCP2. The first area SCP1 may function as a source area and may be a first conductive area doped with a corresponding impurity. The second area SCP2 may function as a drain area and may be a second conductive area doped with a corresponding impurity. The third area SCP3 may function as a channel area and may be an area doped with no impurity.

A first hole H1 may be formed between the first area SCP1 and the third area SCP3. A second hole H2 may be formed between the second area SCP2 and the third area SCP3. The first hole H1 and the second hole H2 may be formed by etching the semiconductor pattern SCP during a process of forming a gate electrode GE, a first transistor electrode TE1, and/or a second transistor electrode TE2, which will be described below.

As illustrated in FIGS. 12 to 14, the semiconductor pattern SCP may include tails ST1 and ST2. For example, the first area SCP1 may include a first tail ST1, and the second area SCP2 may include a second tail ST2. The first tail ST1 may mean a part of the first area SCP1 that is exposed from the first transistor electrode TE1, which will be described below. The second tail ST2 may mean a part of the second area SCP2 that is exposed from the second transistor electrode TE2, which will be described below.

A gate insulating layer GI may be located on the buffer layer BFL and the semiconductor pattern SCP. The gate insulating layer GI may include, or define, opening areas OP1 and OP2. The first opening area OP1 may at least partially expose the first area SCP1 of the semiconductor pattern SCP. The first hole H1 of the semiconductor pattern SCP described above may overlap the first opening area OP1 of the gate insulating layer GI.

The second opening area OP2 may at least partially expose the second area SCP2 of the semiconductor pattern SCP. The second hole H2 of the semiconductor pattern SCP described above may overlap the second opening area OP2 of the gate insulating layer GI.

The gate insulating layer GI may be formed of a single layer or multiple layers, and include various inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The gate electrode GE, the first transistor electrode TE1, and/or the second transistor electrode TE2 may be located on the gate insulating layer GI. The gate electrode GE, the first transistor electrode TE1, and/or the second transistor electrode TE2 may be located on the same layer. For example, the gate electrode GE, the first transistor electrode TE1, and/or the second transistor electrode TE2 may be concurrently or substantially simultaneously formed through the same process, but the present disclosure is not limited thereto.

The gate electrode GE may be located on the gate insulating layer GI and may overlap the third area SCP3 of the semiconductor pattern SCP in a third direction DR3 (a Z-axis direction). The gate electrode GE may be located between the first opening area OP1 and the second opening area OP2 of the above-stated gate insulating layer GI.

The first transistor electrode TE1 may contact the first area SCP1 of the semiconductor pattern SCP through the first opening area OP1 of the gate insulating layer GI. The first transistor electrode TE1 may be a source electrode. Furthermore, the first transistor electrode TE1 may be electrically connected with the first bottom conductive layer BML1 through a contact hole passing through the gate insulating layer GI and the buffer layer BFL. The second transistor electrode TE2 may contact the second area SCP2 of the semiconductor pattern SCP through the second opening area OP2 of the gate insulating layer GI. The second transistor electrode TE2 may be a drain electrode.

The gate electrode GE, the first transistor electrode TE1, and/or the second transistor electrode TE2 each may have a single layer structure or a multilayer structure that is formed of molybdenum (Mo), copper (Cu), aluminum (Al), chrome (Cr), gold (Au), titanium (Ti), nickel (Ni), neodymium (Nd), indium (In), tin (Sn), and an oxide or alloy thereof. For example, as illustrated in FIGS. 12 to 14, the gate electrode GE may include a first layer Ga and a second layer Gb. The second layer Gb of the gate electrode GE may be located on the first layer Ga of the gate electrode GE. The first layer Ga of the gate electrode GE may be formed of titanium (Ti), and the second layer Gb of the gate electrode GE may be formed of copper (Cu), but the present disclosure is not limited thereto. As illustrated in FIGS. 12 and 13, a tail GT may be formed during a process of etching the gate electrode GE. The tail GT of the gate electrode GE may mean a part of the first layer Ga of the gate electrode GE that is exposed from the second layer Gb of the gate electrode GE. However, the present disclosure is not limited thereto. As illustrated in FIG. 14, the tail GT of the gate electrode GE may be omitted depending on etching processes.

Likewise, the first transistor electrode TE1 may include a first layer T1$a$ and a second layer T1$b$. The second layer T1$b$ of the first transistor electrode TE1 may be located on the first layer T1$a$ of the first transistor electrode TE1. The first layer T1$a$ of the first transistor electrode TE1 may be formed of titanium (Ti), and the second layer T1$b$ of the first transistor electrode TE1 may be formed of copper (Cu), but the present disclosure is not limited thereto. Furthermore, as illustrated in FIGS. 12 and 13, a tail TT1 may be formed during a process of etching the first transistor electrode TE1.

The tail TT1 of the first transistor electrode TE1 may mean a part of the first layer T1$a$ of the first transistor electrode TE1 that is exposed from the second layer T1$b$ of the first transistor electrode TE1. However, the present disclosure is not limited thereto. As illustrated in FIG. 14, the tail TT1 of the first transistor electrode TE1 may be omitted depending on etching processes.

Likewise, the second transistor electrode TE2 may include a first layer T2$a$ and a second layer T2$b$. The second layer T2$b$ of the second transistor electrode TE2 may be located on the first layer T2$a$ of the second transistor electrode TE2. The first layer T2$a$ of the second transistor electrode TE2 may be formed of titanium (Ti), and the second layer T2$b$ of the second transistor electrode TE2 may be formed of copper (Cu), but the present disclosure is not limited thereto. Furthermore, as illustrated in FIGS. 12 and 13, a tail TT2 may be formed during a process of etching the second transistor electrode TE2. The tail TT2 of the second transistor electrode TE2 may mean a part of the first layer T2$a$ of the second transistor electrode TE2 that is exposed from the second layer T2$b$ of the second transistor electrode TE2. However, the present disclosure is not limited thereto. As illustrated in FIG. 14, the tail TT2 of the second transistor electrode TE2 may be omitted depending on etching processes.

A passivation layer PSV may be located on the gate electrode GE, the first transistor electrode TE1, and/or the second transistor electrode TE2. The passivation layer PSV may be formed of a single layer or multiple layers, and include various inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

A via layer VIA may be located on the passivation layer PSV. The via layer VIA may be formed of organic material for planarizing a stepped structure formed thereunder. For example, the via layer VIA may include organic material, such as acrylic resin, epoxy resin, phenolic resin, polyamide resin, polyimide resin, polyester resin, polyphenylene sulfide resin, or benzocyclobutene (BCB). However, the present disclosure is not limited thereto. The via layer VIA may include various inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), or titanium oxide ($TiO_x$).

The electrodes ALE may be located on the via layer VIA. The electrodes ALE may be located at positions spaced apart from each other. The electrodes ALE may be located on the same layer. For example, the electrodes ALE may be concurrently or substantially simultaneously formed through the same process, but the present disclosure is not limited thereto.

The electrodes ALE may be supplied with alignment signals at the operation of aligning the light emitting elements LD. Therefore, an electric field may be formed between the electrodes ALE, so that the light emitting elements LD that are provided in each of the pixels PXL may be aligned between the electrodes ALE.

The electrodes ALE may include at least one conductive material. For example, the electrodes ALE may include at least one conductive material among at least one metal of various metal materials including silver (Ag), magnesium (Mg), aluminum (Al), platinum (Pt), palladium (Pd), gold (Au), nickel (Ni), neodymium (Nd), iridium (Ir), chrome (Cr), titanium (Ti), molybdenum (Mo), copper (Cu), etc., or an alloy thereof, conductive oxide, such as indium tin oxide (ITO), indium zinc oxide (IZO), indium tin zinc oxide (ITZO), aluminum zinc oxide (AZO), gallium zinc oxide (GZO), zinc tin oxide (ZTO), or gallium tin oxide (GTO), and a conductive polymer, such as PEDOT, but the present disclosure is not limited thereto.

The bank BNK may be located on the via layer VIA. The bank BNK may include or define an opening that overlaps the emission area EA. The opening of the bank BNK may provide space to which the light emitting elements LD are to be provided at the operation of supplying the light emitting elements LD to each pixel PXL. For example, a suitable kind and/or amount of light emitting element ink may be supplied to the space defined by the opening of the bank BNK.

The bank BNK may have various shapes depending on embodiments. In one or more embodiments, the bank BNK may have a shape protruding from the base layer BSL in the third direction (the Z-axis direction). Furthermore, the bank BNK may have an inclined surface that is inclined at a corresponding angle with respect to the base layer BSL. However, the present disclosure is not limited thereto. The bank BNK may have a sidewall having a curved or stepped shape. For example, the bank BNK may have a cross-sectional shape, such as a semi-circular or semi-elliptical shape.

The bank BNK may include at least one organic material and/or inorganic material. For example, the bank BNK may include organic material, such as acrylic resin, epoxy resin, phenolic resin, polyamide resin, polyimide resin, polyester resin, polyphenylene sulfide resin, or benzocyclobutene (BCB). However, the present disclosure is not limited thereto. The bank BNK may include various inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), or titanium oxide ($TiO_x$).

A first insulating layer INS1 may be located on the electrodes ALE and/or the bank BNK. The first insulating layer INS1 may be formed of a single layer or multiple layers, and include various inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The light emitting elements LD may be located between the electrodes ALE. The light emitting elements LD may be provided in the opening of the bank BNK and may be located between parts of the bank BNK.

The light emitting elements LD may be prepared in a diffused form in the light emitting element ink, and then may be supplied to each of the pixels PXL by an inkjet printing scheme or the like. For example, the light emitting elements LD may be diffused in a volatile solvent and may be supplied to each of the pixels PXL. Thereafter, if alignment signals are supplied to the electrodes ALE, an electric field may be formed between the electrodes ALE so that the light emitting elements LD may be aligned between the electrodes ALE. After the light emitting elements LD have been aligned, the solvent may be removed by a volatilization scheme or other schemes. In this way, the light emitting elements LD may be reliably arranged between the electrodes ALE.

A second insulating layer INS2 may be located on the light emitting elements LD. For example, the second insulating layer INS2 may be partially provided on the light emitting elements LD so that the first and second ends EP1 and EP2 of the light emitting elements LD are exposed from the second insulating layer INS2. In case that the second insulating layer INS2 is formed on the light emitting elements LD after the alignment of the light emitting elements LD has been completed, the likelihood of the light emitting elements LD being removed from the aligned positions may be reduced or prevented.

The second insulating layer INS2 may be formed of a single layer or multiple layers, and include various inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The connection electrodes ELT may be located on the first and second ends EP1 and EP2 of the light emitting elements LD that are exposed from the second insulating layer INS2. The first connection electrode ELT1 may be directly located on the first ends EP1 of the first light emitting elements LD1, and may contact the first ends EP1 of the first light emitting elements LD1.

Furthermore, the second connection electrode ELT2 may be directly located on the second ends EP2 of the first light emitting elements LD1, and may contact the second ends EP2 of the first light emitting elements LD1. Furthermore, the second connection electrode ELT2 may be directly located on the first ends EP1 of the second light emitting elements LD2, and may contact the first ends EP1 of the second light emitting elements LD2. In other words, the second connection electrode ELT2 may electrically connect the second ends EP2 of the first light emitting elements LD1 with the first ends EP1 of the second light emitting elements LD2.

Likewise, the third connection electrode ELT3 may be directly located on the second ends EP2 of the second light emitting elements LD2, and may contact the second ends EP2 of the second light emitting elements LD2. Furthermore, the third connection electrode ELT3 may be directly located on the first ends EP1 of the third light emitting elements LD3, and may contact the first ends EP1 of the third light emitting elements LD3. In other words, the third connection electrode ELT3 may electrically connect the second ends EP2 of the second light emitting elements LD2 with the first ends EP1 of the third light emitting elements LD3.

Likewise, the fourth connection electrode ELT4 may be directly located on the second ends EP2 of the third light emitting elements LD3, and may contact the second ends EP2 of the third light emitting elements LD3. Furthermore, the fourth connection electrode ELT4 may be directly located on the first ends EP1 of the fourth light emitting elements LD4, and may contact the first ends EP1 of the fourth light emitting elements LD4. In other words, the fourth connection electrode ELT4 may electrically connect the second ends EP2 of the third light emitting elements LD3 with the first ends EP1 of the fourth light emitting elements LD4.

Likewise, the fifth connection electrode ELT5 may be directly located on the second ends EP2 of the fourth light emitting elements LD4, and may contact the second ends EP2 of the fourth light emitting elements LD4.

The first connection electrode ELT1 may be electrically connected to the first electrode ALE1 through the corresponding contact hole passing through the first insulating layer INS1. The fifth connection electrode ELT5 may be electrically connected to the second electrode ALE2 through the corresponding contact hole passing through the first insulating layer INS1.

In one or more embodiments, the connection electrodes ELT may be formed of a plurality of conductive layers. For example, as illustrated in FIGS. 7 and 8, the first connection electrode ELT1, the third connection electrode ELT3, and the fifth connection electrode ELT5 may be located on the same layer. Furthermore, the second connection electrode ELT2 and the fourth connection electrode ELT4 may be located on the same layer. The first connection electrode ELT1, the third connection electrode ELT3, and the fifth connection electrode ELT5 may be located on the second insulating layer INS2. A third insulating layer INS3 may be located on the first connection electrode ELT1, the third connection electrode ELT3, and the fifth connection electrode ELT5. The second connection electrode ELT2 and the fourth connection electrode ELT4 may be located on the third insulating layer INS3.

As such, in case that the third insulating layer INS3 is located between the connection electrodes ELT that are formed of different respective conductive layers, the connection electrodes ELT may be reliably separated from each other by the third insulating layer INS3, so that electrical stability between the first and second ends EP1 and EP2 of the light emitting elements LD can be secured.

The third insulating layer INS3 may be formed of a single layer or multiple layers, and include various inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

In one or more embodiments, the connection electrodes ELT may be formed of the same conductive layer. For example, as illustrated in FIGS. 9 and 10, the first to fifth connection electrodes ELT1, ELT2, ELT3, ELT4, and ELT5 may be formed of the same conductive layer. For instance, the first to fifth connection electrodes ELT1, ELT2, ELT3, ELT4, and ELT5 may be concurrently or substantially simultaneously formed through the same process. As such, in case that the connection electrodes ELT are concurrently or substantially simultaneously formed, the number of masks may be reduced, the fabrication process may be simplified.

The connection electrodes ELT may be formed of various transparent conductive materials. For example, the connection electrodes ELT may include at least one of various transparent conductive materials including indium tin oxide (ITO), indium zinc oxide (IZO), indium tin zinc oxide (ITZO), aluminum zinc oxide (AZO), gallium zinc oxide (GZO), zinc tin oxide (ZTO), or gallium tin oxide (GTO), and may be substantially transparent or translucent to provide satisfactory transmittance. Hence, light emitted from the first and second ends EP1 and EP2 of the light emitting elements LD may pass through the connection electrodes ELT, and then may be emitted outside the display panel PNL.

A fourth insulating layer INS4 may be located on the connection electrodes ELT. The fourth insulating layer INS4 may be formed of a single layer or multiple layers, and include various inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

Figure 15:
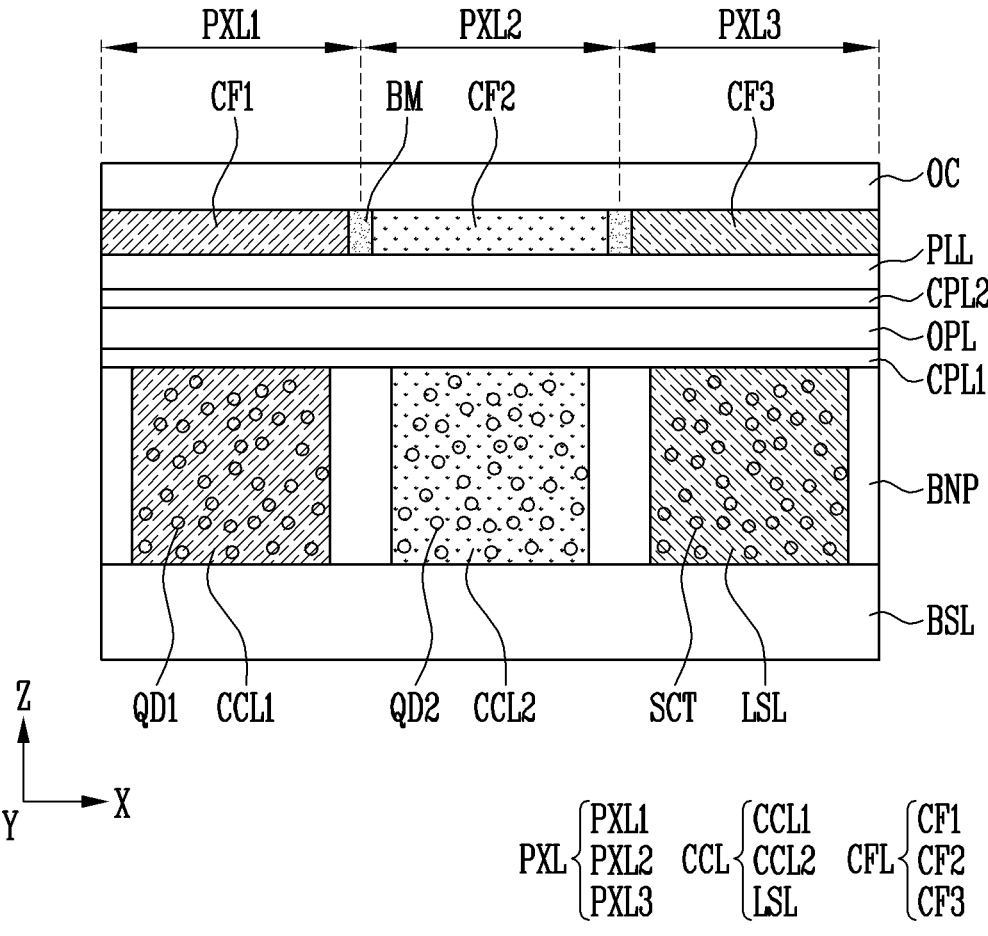
FIG. 15 is a sectional view illustrating first to third pixels in accordance with one or more embodiments.
Figure 16:
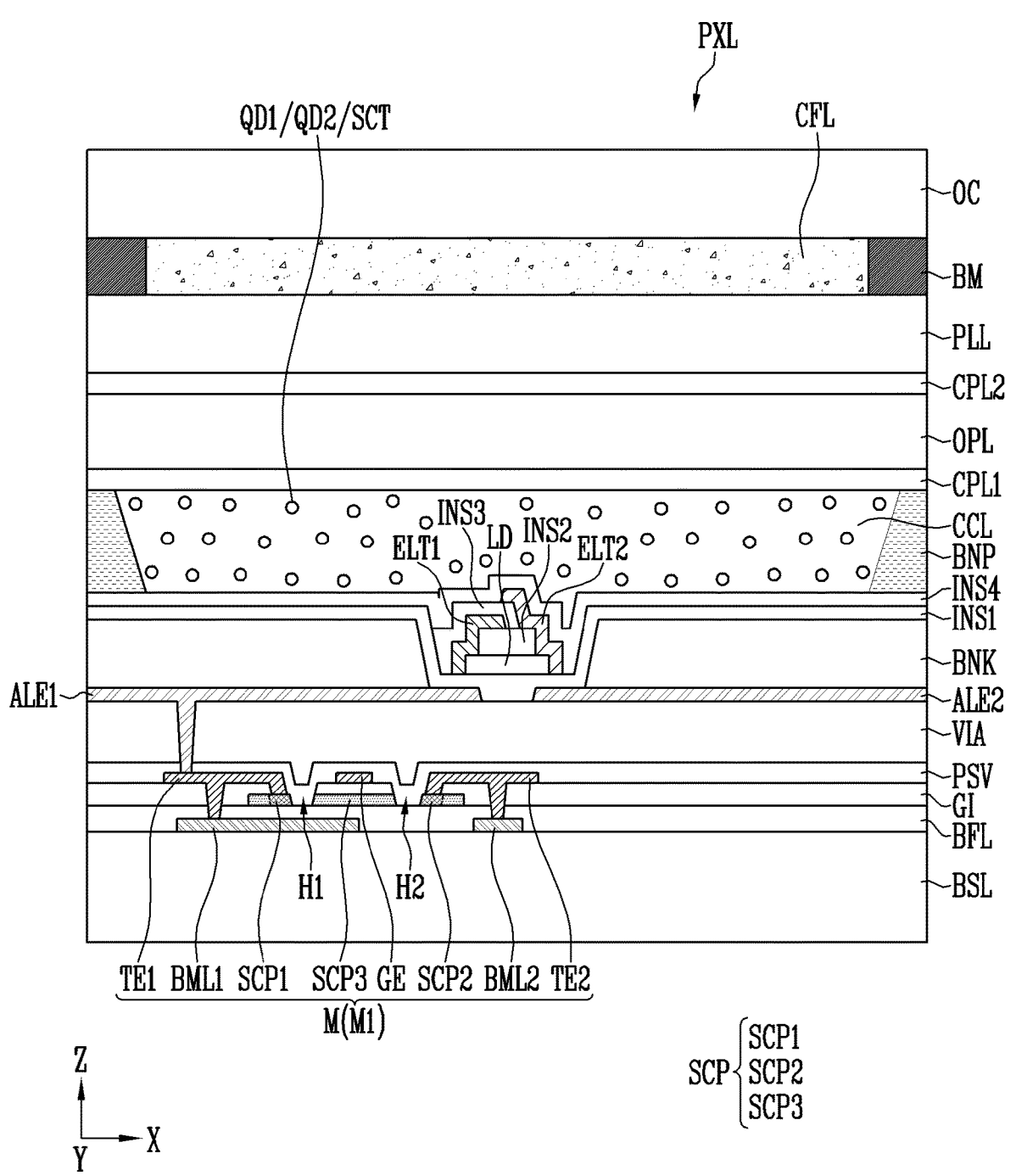
FIG. 16 is a sectional view illustrating a pixel in accordance with one or more embodiments.

FIG. 15 is a sectional view illustrating first to third pixels PXL1, PXL2, and PXL3 in accordance with one or more embodiments. FIG. 16 is a sectional view illustrating a pixel in accordance with one or more embodiments.

FIG. 15 illustrates a color conversion layer CCL, an optical layer OPL, a color filter layer CFL, and/or the like.

For the sake of explanation, in FIG. 15, configurations other than the base layer BSL of FIGS. 7 to 14 is omitted. FIG. 16 illustrates in detail a stacked structure of the pixel PXL with regard to the color conversion layer CCL, the optical layer OPL, and/or the color filter layer CFL.

Referring to FIGS. 15 and 16, a bank pattern BNP may be located between the first to third pixels PXL1, PXL2, and PXL3 or on boundaries therebetween, and may define or include openings that respectively overlap the first to third pixels PXL1, PXL2, and PXL3. The openings of the bank pattern BNP may provide space in which the color conversion layer CCL can be provided.

The color conversion layer CCL may be located on the light emitting elements LD in the openings of the bank pattern BNP. The color conversion layer CCL may include a first color conversion layer CCL1 located in the first pixel PXL1, a second color conversion layer CCL2 located in the second pixel PXL2, and a light scattering layer LSL located in the third pixel PXL3.

In one or more embodiments, the first, second, and third pixels PXL1, PXL2, and PXL3 may include light emitting elements LD configured to emit the same color of light. In one or more embodiments, the first to third pixels PXL1, PXL2, and PXL3 may include light emitting elements LD configured to emit the third color of light (or blue light). Because the color conversion layer CCL including color conversion particles is located in each of the first to third pixels PXL1, PXL2, and PXL3, a full-color image may be displayed.

The first color conversion layer CCL1 may include first color conversion particles for converting the third color of light emitted from the light emitting element LD to the first color of light. For example, the first color conversion layer CCL1 may include a plurality of first quantum dots QD1 that are dispersed in a matrix material, such as base resin.

In one or more embodiments, in case that the light emitting element LD is a blue light emitting element configured to emit blue light and the first pixel PXL1 is a red pixel, the first color conversion layer CCL1 may include the first quantum dots QD1 that convert blue light emitted from the blue light emitting element to red light. The first quantum dots QD1 may absorb blue light, shift the wavelength thereof according to an energy transition, and thus emit red light. In case that the first color pixel PXL1 is a pixel of a different color, the first color conversion layer CCL1 may include the first quantum dots QD1 corresponding to the color of the first pixel PXL1.

The second color conversion layer CCL2 may include second color conversion particles for converting the third color of light emitted from the light emitting element LD to the second color of light. For example, the second color conversion layer CCL2 may include a plurality of second quantum dots QD2 that are dispersed in a matrix material, such as base resin.

In one or more embodiments, in case that the light emitting element LD is a blue light emitting element configured to emit blue light and the second pixel PXL2 is a green pixel, the second color conversion layer CCL2 may include the second quantum dots QD2 that convert blue light emitted from the blue light emitting element to green light. The second quantum dots QD2 may absorb blue light, shift the wavelength thereof according to an energy transition, and thus emit green light. In case that the second color pixel PXL2 is a pixel of a different color, the second color conversion layer CCL2 may include the second quantum dots QD2 corresponding to the color of the second pixel PXL2.

In one or more embodiments, as blue light having a relatively short wavelength in a visible ray area is incident on each of the first quantum dots QD1 and the second quantum dots QD2, absorption coefficients of the first quantum dot QD1 and the second quantum dot QD2 may be increased. Therefore, eventually, the efficiency of light emitted from the first pixel PXL1 and the second pixel PXL2 may be enhanced, and satisfactory color reproducibility may be secured. Furthermore, because an emission circuit EMU including the first to third pixels PXL1, PXL2, and PXL3 is formed of light emitting elements LD (e.g., blue light emitting elements) configured to emit the same color of light, the efficiency of the process of fabricating the display device may be enhanced.

The light scattering layer LSL may be provided to efficiently use the third color of light (or blue light) emitted from the light emitting element LD. For example, in case that the light emitting element LD is a blue light emitting element configured to emit blue light and the third pixel PXL3 is a blue pixel, the light scattering layer LSL may include at least one type of light scatterers SCT to efficiently use light emitted from the light emitting element LD. For example, the light scatterers SCT of the light scattering layer LSL may include at least one of barium sulfate (BaSO4), calcium carbonate (CaCO3), titanium oxide (TiO2), silicon oxide (SiO2), aluminum oxide (Al2O3), zirconium oxide (ZrO2), and zinc oxide (ZnO). The light scatterers SCT may not only be provided in the third pixel PXL3, but may also be selectively included in the first conversion layer CCL1 or the second color conversion layer CCL2. In one or more embodiments, the light scatterers SCT may be omitted, and the light scattering layer LSL may be formed of transparent polymer.

A first capping layer CPL1 may be located on the color conversion layer CCL. The first capping layer CPL1 may be provided over the first to third pixels PXL1, PXL2, and PXL3. The first capping layer CPL1 may cover the color conversion layer CCL. The first capping layer CPL1 may reduce or prevent the likelihood of the color conversion layer CCL being damaged or contaminated by permeation of external impurities, such as water or air.

The first capping layer CPL1 may be an inorganic layer, and may be formed of silicon nitride ($SiN_x$), aluminum nitride ($AlN_x$), titanium nitride ($TiN_x$), silicon oxide ($SiO_x$), aluminum oxide ($AlO_x$), titanium oxide ($TiO_x$), silicon oxycarbide ($SiO_xC_y$), or silicon oxynitride ($SiO_xN_y$).

The optical layer OPL may be located on the first capping layer CPL1. The optical layer OPL may function to recycle light provided from the color conversion layer CCL by total reflection, and thus may enhance light extraction efficiency. Hence, the optical layer OPL may have a relatively low refractive index compared to that of the color conversion layer CCL. For example, the refractive index of the color conversion layer CCL may approximately range from about 1.6 to about 2.0, and the refractive index of the optical layer OPL may approximately range from about 1.1 to about 1.3.

A second capping layer CPL2 may be located on the optical layer OPL. The second capping layer CPL2 may be provided over the first to third pixels PXL1, PXL2, and PXL3. The second capping layer CPL2 may cover the optical layer OPL. The second capping layer CPL2 may reduce or prevent the likelihood of the optical layer OPL being damaged or contaminated by permeation of external impurities, such as water or air.

The second capping layer CPL2 may be an inorganic layer, and may be formed of silicon nitride ($SiN_x$), aluminum nitride ($AlN_x$), titanium nitride ($TiN_x$), silicon oxide ($SiO_x$), aluminum oxide ($AlO_x$), titanium oxide ($TiO_x$), silicon oxy-carbide ($SiO_xC_y$), or silicon oxynitride ($SiO_xN_y$).

A planarization layer PLL may be located on the second capping layer CPL2. The planarization layer PLL may be provided over the first to third pixels PXL1, PXL2, and PXL3.

The planarization layer PLL may include organic material, such as acrylic resin, epoxy resin, phenolic resin, polyamide resin, polyimide resin, polyester resin, polyphenylene sulfide resin, or benzocyclobutene (BCB). However, the present disclosure is not limited thereto. The planarization layer PLL may include various inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The color filter layer CFL may be located on the planarization layer PLL. The color filter layer CFL may include color filters CF1, CF2, and CF3 corresponding to the colors of the respective pixels PXL. Because the color filters CF1, CF2, and CF3 corresponding to the respective colors of the first to third pixels PXL1, PXL2, and PXL3 are located, a full-color image may be displayed.

The color filter layer CFL may include a first color filter CF1 located in the first pixel PXL1 and configured to allow light emitted from the first pixel PXL1 to selectively pass therethrough, a second color filter CF2 located in the second pixel PXL2 and configured to allow light emitted from the second pixel PXL2 to selectively pass therethrough, and a third color filter CF3 located in the third pixel PXL3 and configured to allow light emitted from the third pixel PXL3 to selectively pass therethrough.

In one or more embodiments, the first color filter CF1, the second color filter CF2, and the third color filter CF3 may be respectively a red color filter, a green color filter, and a blue color filter, but the present disclosure is not limited thereto. Hereinafter, the term "color filter CF" or "color filters CF" will be used to designate any color filter among the first color filter CF1, the second color filter CF2, and the third color filter CF3, or may collectively designate two or more kinds of color filters.

The first color filter CF1 may overlap the first color conversion layer CCL1 in the third direction (the Z-axis direction). The first color filter CF1 may include color filter material for allowing the first color of light (or red light) to selectively pass therethrough. For example, in case that the first pixel PXL1 is a red pixel, the first color filter CF1 may include red color filter material.

The second color filter CF2 may overlap the second color conversion layer CCL2 in the third direction (the Z-axis direction). The second color filter CF2 may include color filter material for allowing the second color of light (or green light) to selectively pass therethrough. For example, in case that the second pixel PXL2 is a green pixel, the second color filter CF2 may include green color filter material.

The third color filter CF3 may overlap the light scattering layer LSL in the third direction (the Z-axis direction). The third color filter CF3 may include color filter material for allowing the third color of light (or blue light) to selectively pass therethrough. For example, in case that the third pixel PXL3 is a blue pixel, the third color filter CF3 may include blue color filter material.

In one or more embodiments, a light-shielding layer BM may be further located between the first to third color filters CF1, CF2, and CF3. In case that the light-shielding layer BM is formed between the first to third color filters CF1, CF2, and CF3, a color mixing defect that is visible from a front surface or side surface of the display device may be reduced or prevented. The material of the light-shielding layer BM is not particularly limited, and various light shielding materials may be used to form the light-shielding layer BM. For example, the light-shielding layer BM may be embodied by stacking the first to third color filters CF1, CF2, and CF3 one on another.

An overcoat layer OC may be located on the color filter layer CFL. The overcoat layer OC may be provided over the first to third pixels PXL1, PXL2, and PXL3. The overcoat layer OC may cover a lower component including the color filter layer CFL. The overcoat layer OC may reduce or prevent the likelihood of water or air permeating the lower component. Furthermore, the overcoat layer OC may protect the lower component from foreign material, such as dust.

The overcoat layer OC may include organic material, such as acrylic resin, epoxy resin, phenolic resin, polyamide resin, polyimide resin, polyester resin, polyphenylene sulfide resin, or benzocyclobutene (BCB). However, the present disclosure is not limited thereto. The overcoat layer OC may include various inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

As described above, in case that the gate electrode GE, the first transistor electrode TE1, and/or the second transistor electrode TE2 are concurrently or substantially simultaneously formed, the number of masks may be reduced, and the fabrication process may be simplified. Furthermore, the characteristics and the resistance of the transistor M may be controlled by adjusting the size or the like of the holes H1 and H2 formed in the semiconductor pattern SCP during the process of etching the gate electrode GE, the first transistor electrode TE1, and/or the second transistor electrode TE2. Hence, the reliability of the transistor M may be enhanced.

Hereinafter, a method of fabricating the transistor in accordance with one or more embodiments will be described.

FIGS. 17 to 20 are sectional views illustrating, by process operations, a method of fabricating the transistor in accordance with one or more embodiments. FIGS. 17 to 20 are plan views and sectional views for describing a method of fabricating the transistor based on FIG. 12. Like references will be used to designate substantially the same components as those of the one or more embodiments corresponding to FIG. 12, and detailed explanation thereof will be omitted.

Figure 17:
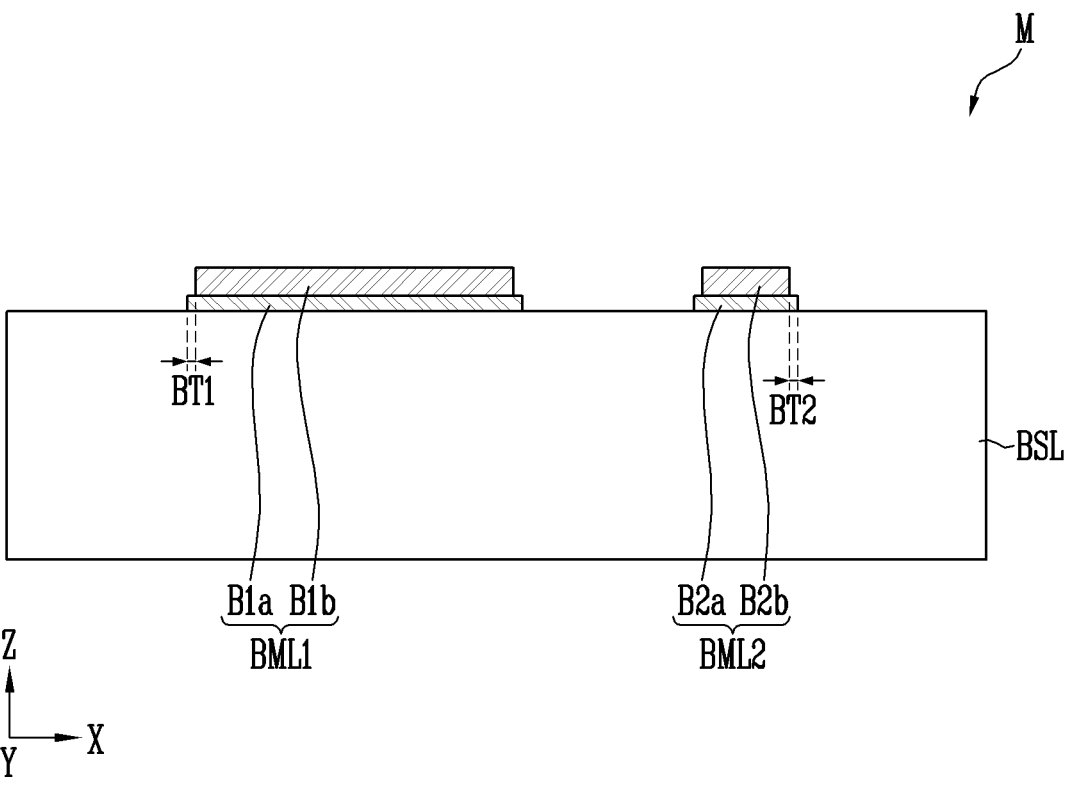
FIGS. 17 to 20 are sectional views illustrating, by process operations, a method of fabricating the transistor in accordance with one or more embodiments.

Referring to FIG. 17, the first bottom conductive layer BML1 and the second bottom conductive layer BML2 are formed on the base layer BSL. The first bottom conductive layer BML1 and the second bottom conductive layer BML2 may be concurrently or substantially simultaneously formed through the same process. The first bottom conductive layer BML1 and the second bottom conductive layer BML2 may be respectively formed of the first layers B1a and B2a and the second layers B1b and B2b. Furthermore, the tails BT1 and BT2 may be formed during the process of etching the first bottom conductive layer BML1 and the second bottom conductive layer BML2, but the present disclosure is not limited thereto.

Figure 18:
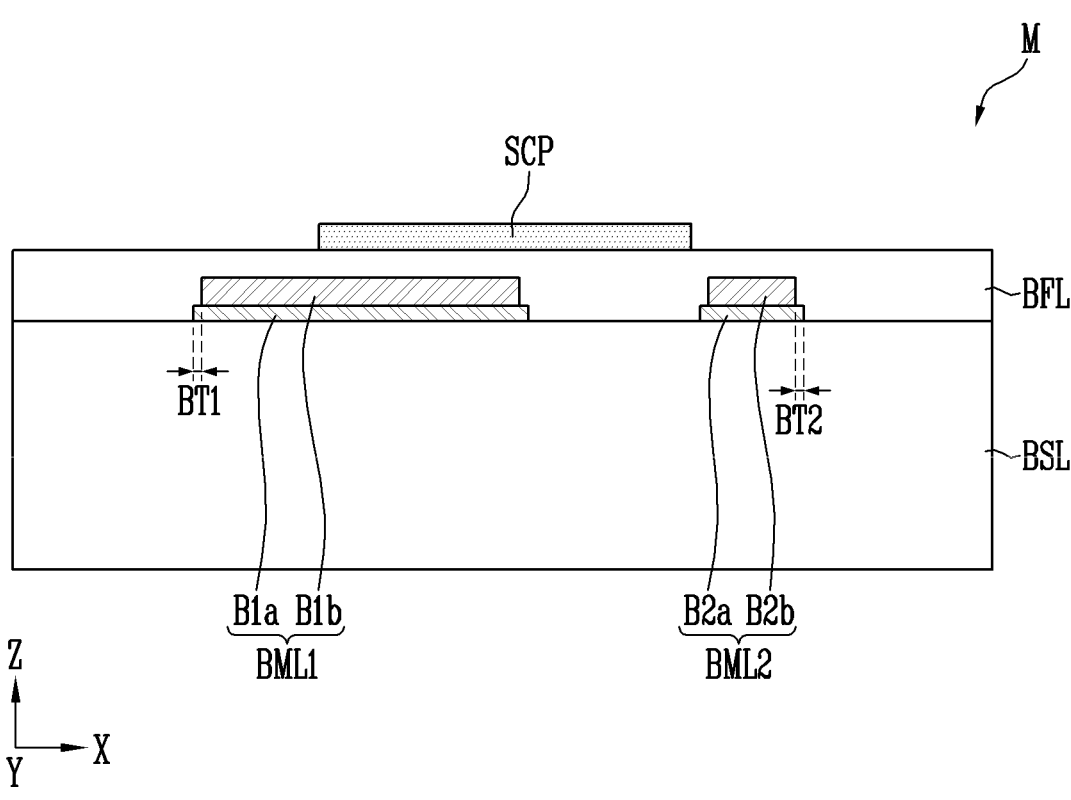

Thereafter, referring to FIG. 18, the buffer layer BFL is formed on the first bottom conductive layer BML1 and the second bottom conductive layer BML2. The semiconductor pattern SCP is formed on the buffer layer BFL.

Figure 19:
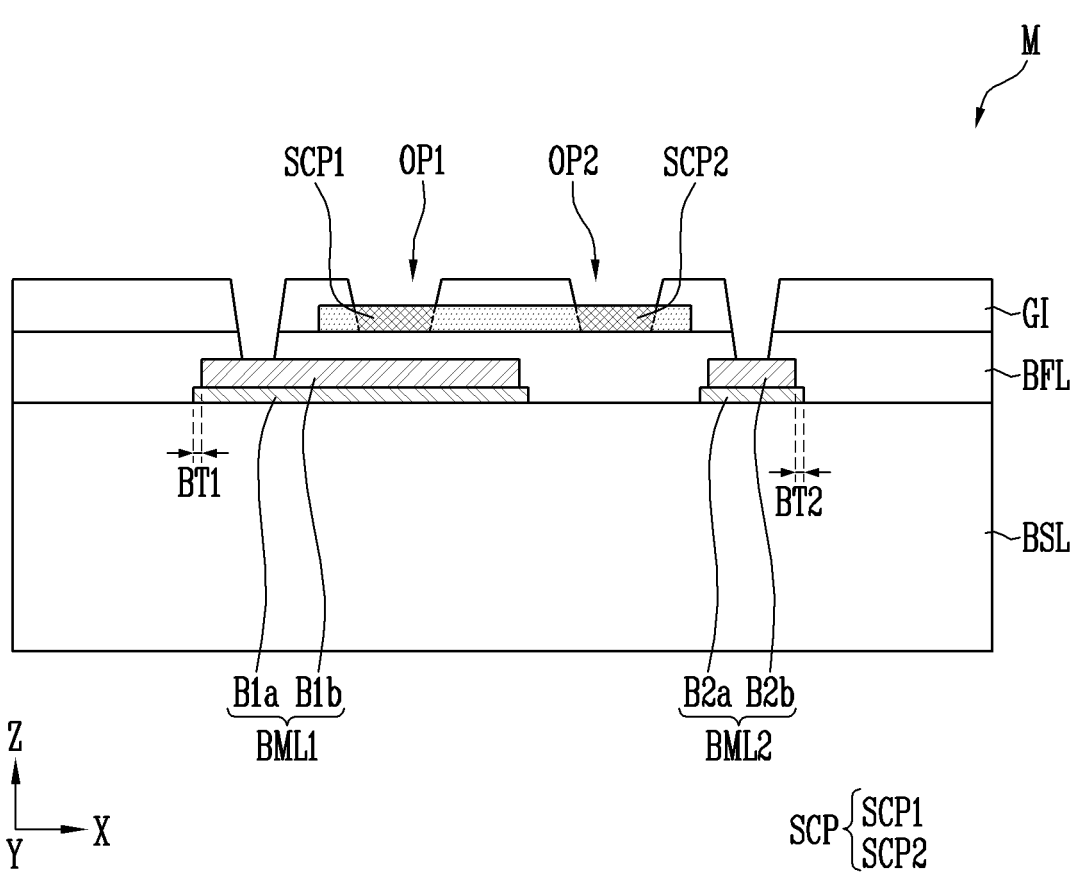

Subsequently, referring to FIG. 19, the gate insulating layer GI is formed on the semiconductor pattern SCP. The opening areas OP1 and OP2 and the contact holes may be formed by etching the gate insulating layer GI. The first opening area OP1 may at least partially expose the semiconductor pattern SCP located thereunder. The second opening area OP2 may at least partially expose the semiconductor pattern SCP located thereunder. The contact holes may at least partially expose the first bottom conductive layer BML1 and the second bottom conductive layer BML2 located thereunder.

Thereafter, the first area SCP1, which is a first conductive area, is formed by doping the semiconductor pattern SCP that is exposed through the first opening area OP1 with a corresponding impurity. Furthermore, the second area SCP2, which is a second conductive area, is formed by doping the semiconductor pattern SCP that is exposed through the second opening area OP2 with a corresponding impurity.

Figure 20:
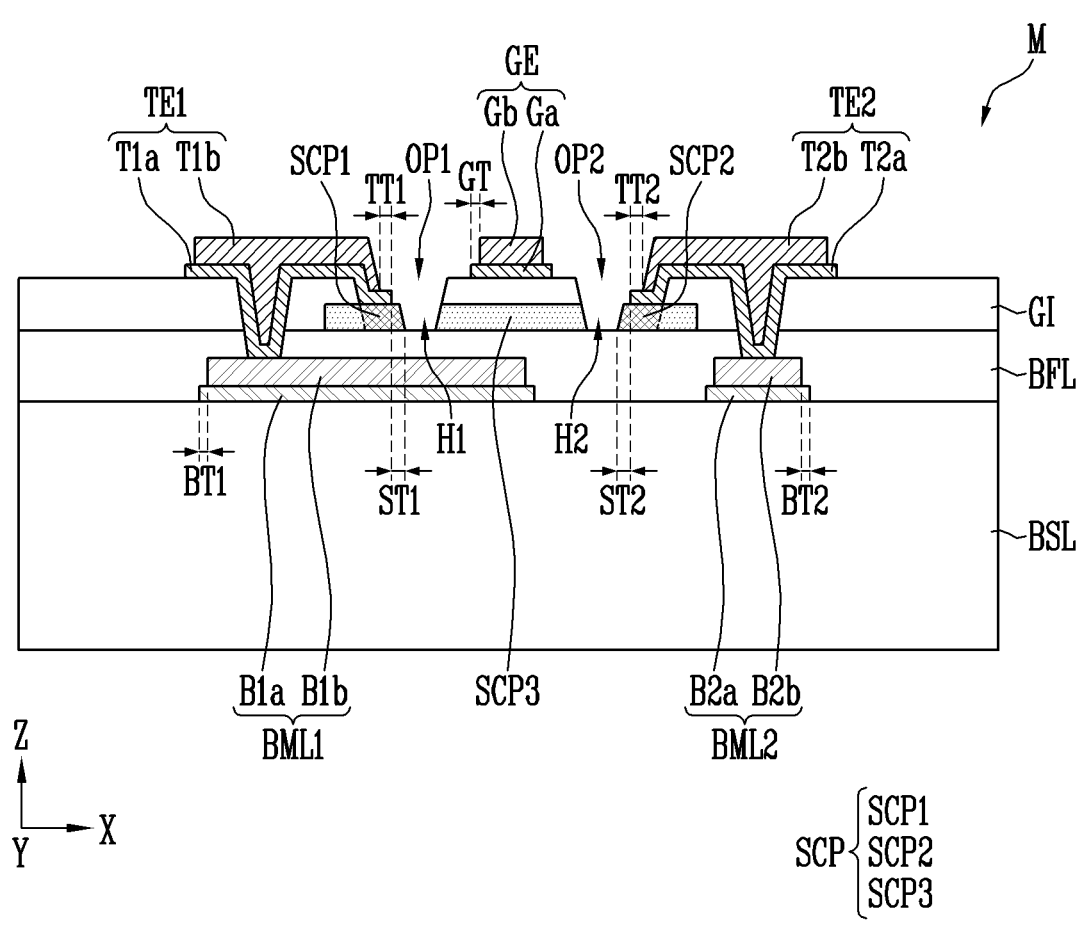

Thereafter, referring to FIG. 20, the gate electrode GE, the first transistor electrode TE1, and/or the second transistor electrode TE2 may be formed on the gate insulating layer GI. The gate electrode GE, the first transistor electrode TE1, and/or the second transistor electrode TE2 may be concurrently or substantially simultaneously formed on the gate insulating layer GI through the same process.

The first transistor electrode TE1 may contact the first area SCP1 of the semiconductor pattern SCP through the first opening area OP1 of the above-stated gate insulating layer GI. The second transistor electrode TE2 may contact the second area SCP2 of the semiconductor pattern SCP through the second opening area OP2 of the above-stated gate insulating layer GI.

The gate electrode GE, the first transistor electrode TE1, and/or the second transistor electrode TE2 on the gate insulating layer GI may be respectively formed of the first layers Ga, T1a, and T2a and the second layers Gb, T1b, and T2b. Furthermore, the tails GT, TT1, and TT2 may be formed during the process of etching the gate electrode GE, the first transistor electrode TE1, and/or the second transistor electrode TE2 (e.g., respectively) on the gate insulating layer GI, but the present disclosure is not limited thereto. Furthermore, the semiconductor pattern SCP that is exposed through the opening areas OP1 and OP2 of the gate insulating layer GI is etched during the process of etching the gate electrode GE, the first transistor electrode TE1, and/or the second transistor electrode TE2 so that the holes H1 and H2 can be formed. For example, the first hole H1 may be formed by etching the first area SCP1 of the semiconductor pattern SCP that is exposed through the first opening area OP1 of the gate insulating layer GI. The second hole H2 may be formed by etching the second area SCP2 of the semiconductor pattern SCP that is exposed through the second opening area OP2 of the gate insulating layer GI. In one or more embodiments, the tails TT1 and TT2 may be formed during the process of etching the semiconductor pattern SCP.

As described above, a gate electrode, a first transistor electrode, and/or a second transistor electrode may be concurrently or substantially simultaneously formed, so that the number of masks may be reduced, and the fabrication process may be simplified. Furthermore, during a process of etching the gate electrode, the first transistor electrode, and/or the second transistor electrode, the size or the like of a hole formed in the semiconductor pattern may be adjusted, so that characteristics and resistance of a transistor can be controlled, whereby the reliability of the transistor may be enhanced.

The aspects of the present disclosure are not limited by the foregoing, and other various aspects are considered herein.

It will be understood by those skilled in the art that various changes in form and details may be made therein without departing from the spirit and scope of the present disclosure as defined by the appended claims. Therefore, the foregoing embodiments should be considered in descriptive sense only and not for purposes of limitation. The scope of the present disclosure is defined not by the detailed description of the present disclosure but by the appended claims, with functional equivalents thereof to be included therein, and all differences within the scope will be construed as being included in the present disclosure.

What is claimed is:

1. A display device comprising:
a semiconductor pattern corresponding to a single transistor above a substrate and defining a hole;
an insulating layer on the semiconductor pattern, and defining an opening area overlapping the hole;
a gate electrode, a source electrode contacting a conductive area of the semiconductor pattern through the opening area, and a drain electrode on the insulating layer;
electrodes respectively on the gate electrode, the source electrode, and the drain electrode, and spaced apart from each other;
light emitting elements between the electrodes, respectively;
a first connection electrode on first ends of the light emitting elements; and
a second connection electrode on second ends of the light emitting elements.

2. The display device according to claim 1, wherein the gate electrode, the source electrode, and the drain electrode are on a same layer.

3. The display device according to claim 1, wherein the conductive area of the semiconductor pattern comprises a tail exposed from the source electrode.

4. The display device according to claim 1, wherein the source electrode comprises a first layer, and a second layer on the first layer, and
wherein the first layer comprises a tail exposed from the second layer.

5. The display device according to claim 1, wherein the first connection electrode and the second connection electrode are provided on a same layer.

6. The display device according to claim 1, further comprising a bank on the electrodes.

7. The display device according to claim 6, wherein the electrodes are respectively between parts of the bank.

8. A display device comprising:
a semiconductor pattern on a substrate and defining a hole;
an insulating layer on the semiconductor pattern, and defining an opening area overlapping the hole;
a gate electrode, a source electrode contacting a conductive area of the semiconductor pattern through the opening area, and a drain electrode on the insulating layer;
electrodes respectively on the gate electrode, the source electrode, and the drain electrode, and spaced apart from each other;
light emitting elements between the electrodes, respectively;
a bottom conductive layer between the substrate and the semiconductor pattern;
a first connection electrode on first ends of the light emitting elements; and a second connection electrode on second ends of the light emitting elements.

9. The display device according to claim 8, wherein the source electrode contacts the bottom conductive layer.

* * * * *